United States Patent
Lok et al.

(10) Patent No.: US 11,641,210 B1
(45) Date of Patent: May 2, 2023

(54) MATRIX PROCESSOR GENERATING SAR-SEARCHED INPUT DELAY ADJUSTMENTS TO CALIBRATE TIMING SKEWS IN A MULTI-CHANNEL INTERLEAVED ANALOG-TO-DIGITAL CONVERTER (ADC)

(71) Applicant: Caelus Technologies Limited, Hong Kong (HK)

(72) Inventors: Chi Fung Lok, Hong Kong (HK); Zhi Jun Li, Guangzhou (CN)

(73) Assignee: Caelus Technologies Limited, Hong Kong (HK)

( * ) Notice: Subject to any disclaimer, the term of this patent is extended or adjusted under 35 U.S.C. 154(b) by 39 days.

(21) Appl. No.: 17/537,460

(22) Filed: Nov. 29, 2021

Related U.S. Application Data

(63) Continuation-in-part of application No. 17/455,471, filed on Nov. 18, 2021.

(51) Int. Cl.
  *H03M 1/10* (2006.01)
  *H03M 1/06* (2006.01)
  (Continued)

(52) U.S. Cl.
  CPC ........ *H03M 1/1014* (2013.01); *H03M 1/0624* (2013.01); *H03M 1/1023* (2013.01);
  (Continued)

(58) Field of Classification Search
  CPC .... H03M 1/1014; H03M 1/1033; H03M 1/12; H03M 1/38; H03M 1/0624; H03M 1/1023
  See application file for complete search history.

(56) References Cited

U.S. PATENT DOCUMENTS

| | | |
|---|---|---|
| 7,312,734 B2 | 12/2007 | McNeill et al. |
| 8,159,377 B2 | 4/2012 | Goldman et al. |

(Continued)

OTHER PUBLICATIONS

Naoki Kurosawa et al., "Explicit Analysis of Channel Mismatch Effects in Time-Interleaved ADC Systems", IEEE TCAS I, vol. 48, No. 3, Mar. 2001.

(Continued)

*Primary Examiner* — Joseph J Lauture
(74) *Attorney, Agent, or Firm* — gPatent LLC; Stuart T Auvinen

(57) ABSTRACT

An N-channel interleaved Analog-to-Digital Converter (ADC) has a variable delay added to each ADC's input sampling clock. The variable delays are each programmed by a Successive-Approximation-Register (SAR) during calibration to minimize timing skews between channels. In each channel the ADC output is filtered, and a product derivative correlator generates a product derivative factor for correlation to two adjacent ADC channels. A matrix processor arranges the product derivative factors from the product derivative correlators into a matrix that is multiplied by a correlation matrix. The correlation matrix is a constant generated from an N×N shift matrix. The matrix processor outputs a sign-bit vector. Each bit in the sign-bit vector determines when tested SAR bits are set or cleared to adjust a channel's variable delay. Sampling clock and component timing skews are reduced to one LSB among all N channels.

20 Claims, 14 Drawing Sheets

(51) Int. Cl.
    *H03M 1/12*    (2006.01)
    *H03M 1/38*    (2006.01)

(52) U.S. Cl.
    CPC ............ *H03M 1/1033* (2013.01); *H03M 1/12* (2013.01); *H03M 1/38* (2013.01)

(56) References Cited

U.S. PATENT DOCUMENTS

| | | |
|---|---|---|
| 8,519,875 B2 | 8/2013 | Straayer et al. |
| 8,872,680 B2 | 10/2014 | Ali |
| 8,890,728 B2 | 11/2014 | Le Dortz et al. |
| 9,608,652 B2 | 3/2017 | Lee et al. |
| 10,312,927 B1 | 6/2019 | Mirhaj et al. |
| 2018/0358976 A1 | 12/2018 | Pu et al. |
| 2022/0057522 A1* | 2/2022 | Mostafanezhad ..... G01S 17/931 |

OTHER PUBLICATIONS

Behzad Razavi, "Design Considerations for Interleaved ADCs", IEEE JSSC, vol. 48, No. 8, Aug. 2013.

Hegong Wei et al., "An 8 Bit 4GS/s 120mW CMOS ADC", IEEE JSSC, vol. 49, No. 8, Aug. 2014.

Nicolas Le Dortz et al., "A 1.62GS/s Time-Interleaved SAR ADC with Digital Background Mismatch Calibration Achieving Interleaving Spurs Below 70 dBFS", ISSCC, p. 386-388, Feb. 2014.

Ru Yi et al., "Digital Compensation for Timing Mismatch in Interleaved ADCs", 2013 Asian Test Sym., Proc. IEEE, Nov. 18, 2013, pp. 134-139.

Manar El-Chammas et al., "A 12-GS/s 81-mW 5-bit Time-Interleaved Flash ADC with Background Timing Skew Calibration", IEEE JSSC, vol. 46, No. 4, Mar. 3, 2011, pp. 838-847.

* cited by examiner

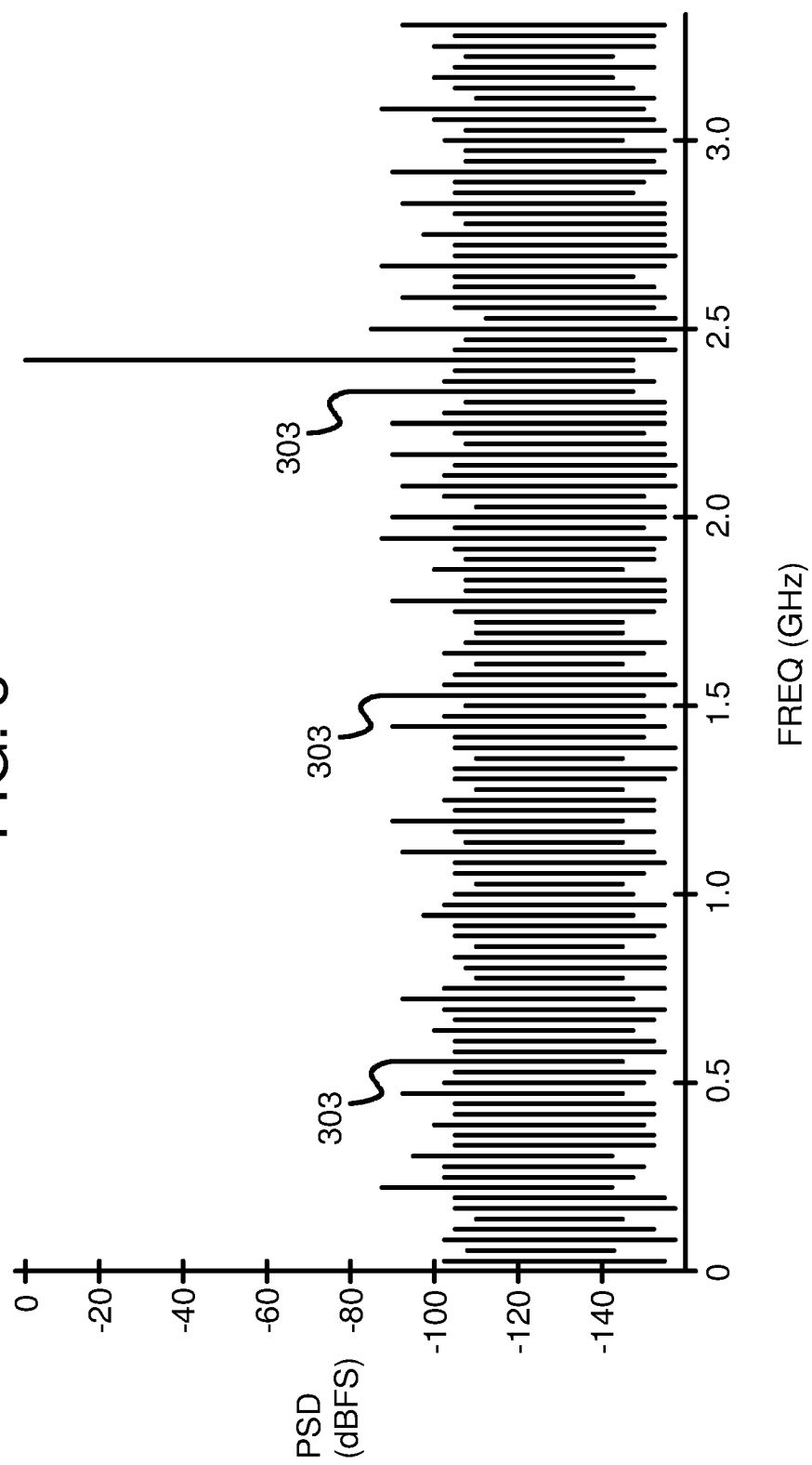

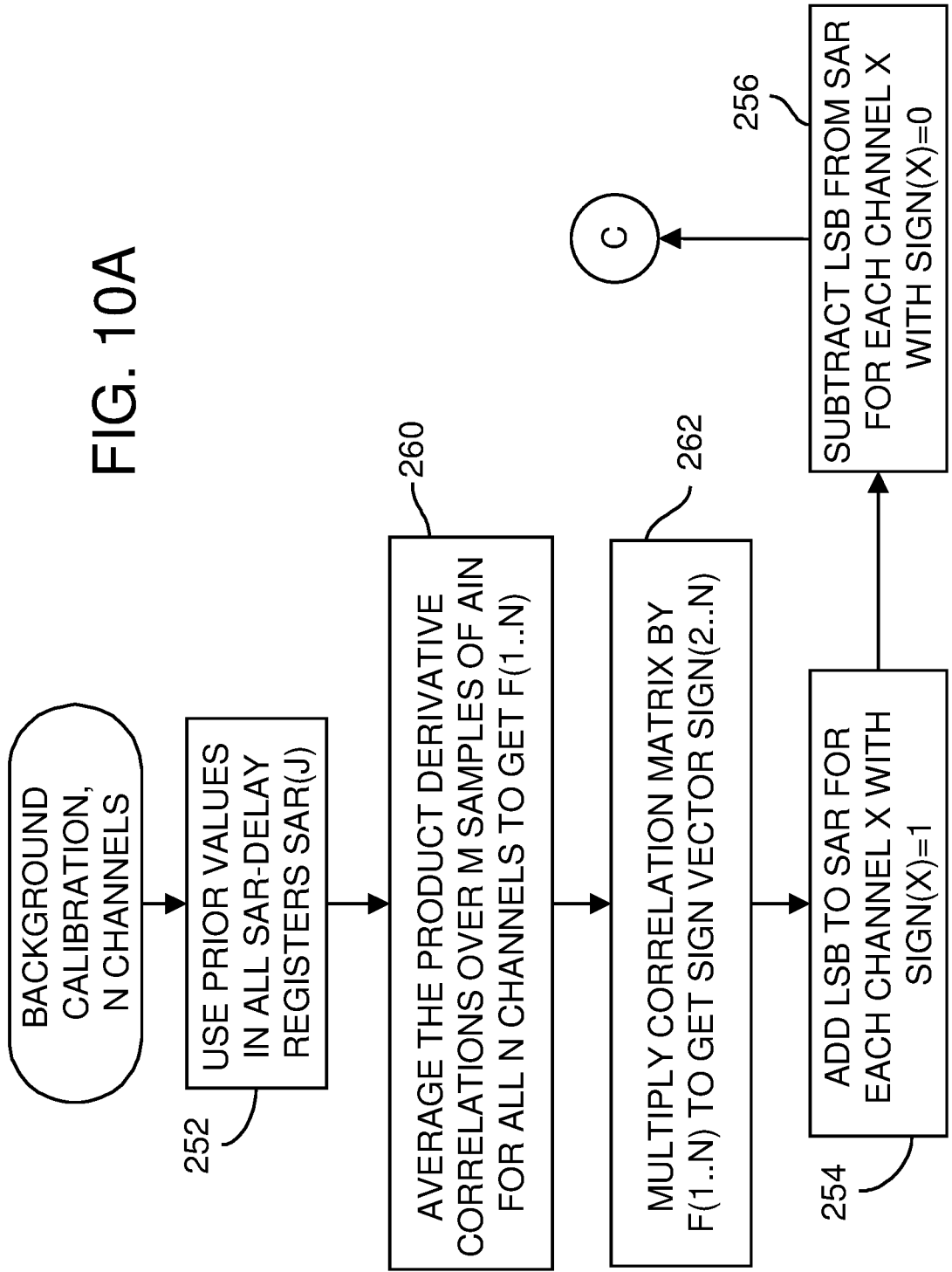

N = 6
(EVEN,
NON-
BINARY)

N = 7 (ODD)

US 11,641,210 B1

MATRIX PROCESSOR GENERATING SAR-SEARCHED INPUT DELAY ADJUSTMENTS TO CALIBRATE TIMING SKEWS IN A MULTI-CHANNEL INTERLEAVED ANALOG-TO-DIGITAL CONVERTER (ADC)

RELATED APPLICATION

This invention is a Continuation-in-Part (CIP) of "Calibration of Timing Skews in a Multi-Channel Interleaved Analog-to-Digital Converter (ADC) by Auto-Correlation of Muxed-Together Channels in Binary Output Tree", U.S. Ser. No. 17/455,471, filed Nov. 18, 2021.

FIELD OF THE INVENTION

This invention relates to Analog-to-Digital Converters (ADC), and more particularly to calibration of interleaved ADCs.

BACKGROUND OF THE INVENTION

Analog-to-Digital Converters (ADCs) are widely used to convert analog signals to digital values. Multi-bit ADCs have a high resolution, and its accuracy can be improved by calibration. Higher sampling rates can be achieved by interleaving two ADCs that each operate at half the sampling rate.

FIG. 1 shows a prior-art interleaved ADC. ADC 10 and ADC 12 are interleaved, with ADC 10 sampling analog input AIN when clock CLK closes switch 20, and ADC 12 sampling analog input AIN when inverse clock CLKB closes switch 22. Mux 18 selects digital output Y1 from ADC 10 when CLK is high, when ADC 10 has had sufficient time to sample and hold AIN and convert it to a digital value. The digital output DOUT is Y2 when CLK is low to mux 18. Thus, each of ADC 10, 12 can operate at half the data rate of the final output DOUT.

FIG. 2 is a graph of analog sampling and clock skew. AIN is sampled into ADC 10 to generate Y1[K−1] and Y1[K] on the falling edges of CLK, while AIN is sampled into ADC 12 to generate Y2[K−1] and Y2[K] on the falling edges of CLKB, where K is the sample or time-index number. The sampling time or period of AIN is Ts. Ideally there is no clock skew in CLK, and all samples are separated by Ts. However, CLK may not have a pulse width that is exactly 50% of period 2*Ts, introducing sampling pulse-width mismatch and non-linearities. Sampling of channel Y2 may be delayed relative to sampling of channel Y1 by Ts+ΔT/2, while Sampling of channel Y1 may be delayed relative to sampling of channel Y2 by Ts−ΔT/2. Ideally ΔT=0 without mismatch on sampling. However, in reality ΔT is finite. It is desired to reduce ΔT to a minimal acceptable level for more than 2 channels.

ADC 10, 12 and switches 20, 22 may not be exactly matched, introducing finite bandwidth mismatches among the two channels Y1, Y2. Thus, both sampling-pulse mismatches and ADC component mismatches may contribute to nonlinearities.

FIG. 3 is a graph of spurious tones in a spectrum for a prior-art interleaved ADC. Sampling pulse-width mismatches and component mismatches may introduce non-linearities or errors that cause spurious tones 302. These spurious tones can occur at integer multiples of Fs/N, K*Fs/N±F, wherein K is an integer, where Fs is the sampling frequency (period Ts=1/Fs), and N is the number of channels interleaved together. These spurious tones are undesirable since they can restrict the dynamic range of high-speed ADCs and are proportional to analog input signal amplitude and frequency.

What is desired is a highly-interleaved ADC with at least 3 ADC channels interleaved together for operation at higher sampling rates. It is desired to introduce a variable, programmable delay to each of the channel inputs to correct for timing skews caused by sampling pulse-width, clock, and component mismatches among the 3 or more channels interleaved together. A calibration method is desired to test various values of these delays to program these delays to minimize the skew among the multiple channels. Both a rapid foreground calibration method and a background calibration method to adjust for gradual temperature skews are desired.

BRIEF DESCRIPTION OF THE DRAWINGS

FIG. 8 is a graph of reduced spurious tones in a spectrum for an interleaved ADC with channel input delays calibrated by product derivative correlators and matrix processing.

FIGS. 10A-10B show a flowchart of a background calibration process.

DETAILED DESCRIPTION

The present invention relates to an improvement in interleaved ADC calibration. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described but is to be accorded the widest scope consistent with the principles and novel features herein disclosed.

Figure 4:
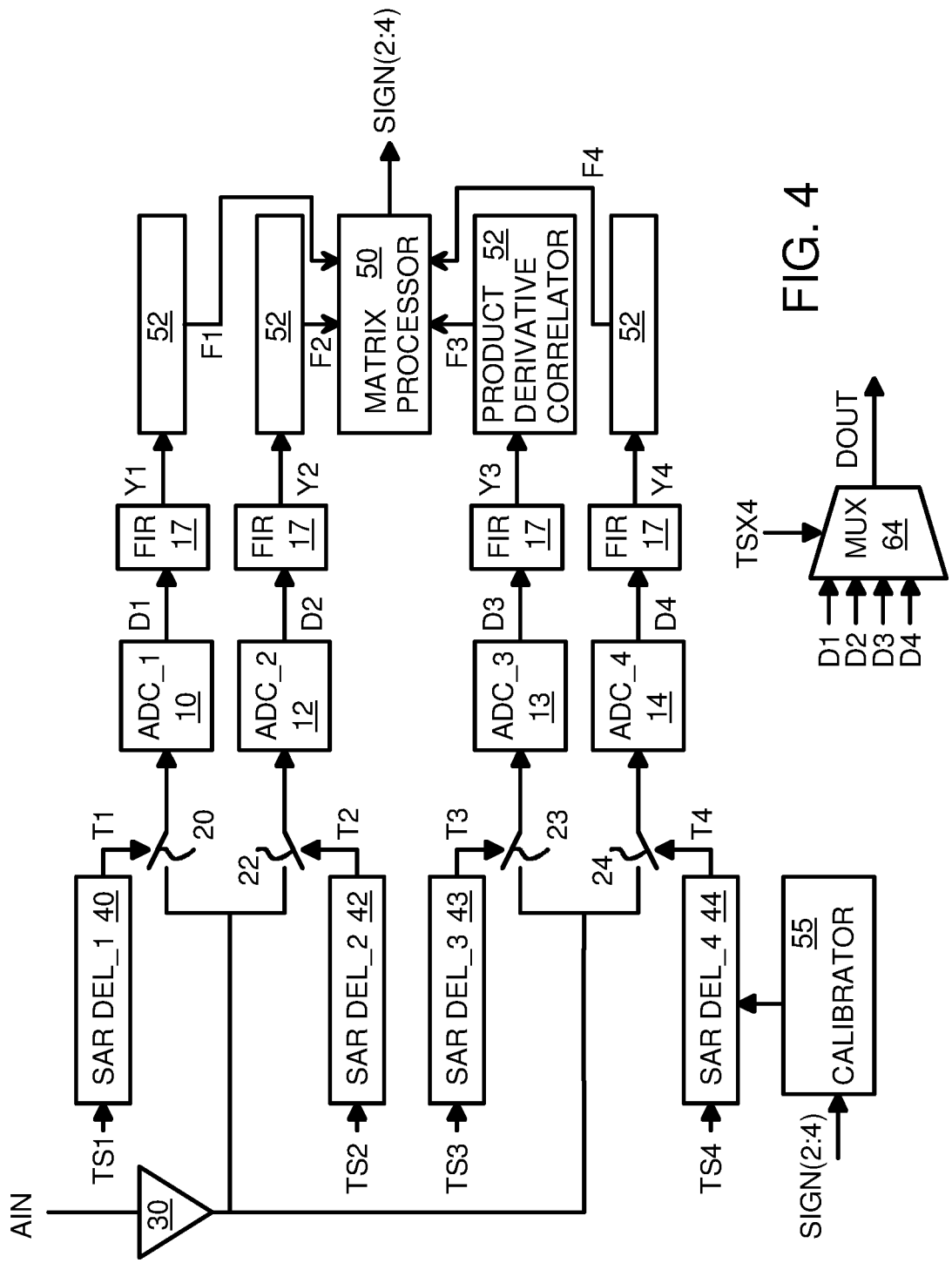
FIG. 4 is a block diagram of a 4-channel interleaved ADC with product derivative correlators and a matrix processor for calibration of programmable input delays.

FIG. 4 is a block diagram of a 4-channel interleaved ADC with product derivative correlators and a matrix processor for calibration of programmable input delays. Analog input AIN is buffered by analog buffer 30 and sampled by switches 20, 22, 23, 24 into ADC 10, 12, 13, 14 that generate digital values D1, D2, D3, D4, respectively. Mux 64 alternately selects D1, D2, D3, D4 to generate the final data output DOUT. Final mux 64 operates with clock TSX4 that has four times the frequency of sampling clock TS1.

Sampling clocks TS1, TS2, TS3, TS4 can be a four-phase clock all operating at the same frequency but with phase shifts of 0, 90, 180, and 270 degrees. Sampling clocks TS1, TS2, TS3, TS4 are delayed by variable delays to generate clocks T1, T2, T3, T4 that control switches 20, 22, 23, 24, respectively, that sample AIN to ADC 10, 12, 13, 14 that generate channel digital outputs D1, D2, D3, D4, having phases of 0, 90, 180, and 270 degrees. These variable delays are programmed during calibration with digital values that are stored in a Successive-Approximation-Register (SAR) that enable and disable binary-weighted capacitor delay elements. Calibration uses a Successive-Approximation method testing larger, Most-Significant Bit (MSB) capacitors first, then testing successively smaller capacitors until a Least-Significant Bit (LSB) capacitor is tested.

SAR delay 40 delays sampling clock TS1 to generate T1 to switch 20, while SAR delays 42, 43, 44 delay sampling clocks TS2, TS3, TS4 to generate T2, T3, T4 to switches 22, 23, 24, respectively. By adjusting the delay values programmed into SAR delays 40, 42, 43, 44, the timing skews between channels D1, D2, D3, D4 can be compensated for and matched to within the delay of 1 LSB capacitor in SAR delay 40, 42, 43, 44.

Finite-Impulse-Response (FIR) filters 17 filter digital outputs D1, D2, D3, D4 from ADC 10, 12, 13, 14 to generate filtered digital values Y1, Y2, Y3, Y4. FIR filters 17 can act as lowpass or bandpass filters for calibration.

Product derivative correlators 52 receive filtered digital values Y1, Y2, Y3, Y4 and generate product derivative factors F1, F2, F3, F4. The product derivative factor F2 is a function of the current channel filtered digital value Y2, and the adjacent channels Y1, Y3. In general, the product derivative factor F(X) for a channel X has inputs Y(X), Y(X−1), and Y(X+1), where X−1 and X+1 are modulo N, where N is the number of interleaved channels. Each product derivative correlator 52 generates a correlation factor of the current channel compared to the two adjacent channels. Product derivative correlator 52 can be a mid-point correlator such as shown by the logic implemented of FIG. 6.

Matrix processor 50 receives product derivative factors F1, F2, F3, F4 from product derivative correlators 52, and forms a matrix from F1, F2, F3, F4 that is multiplied by a correlation matrix to generate sign bits. The correlation matrix is constant matrix that is fixed for a fixed number of channels N.

During calibration, the delay in SAR delay 40 is fixed and acts as a timing reference for the other N−1 channels. Therefore, the sign bit for channel 1 is not generated by matrix processor 50.

For a constant or slow-moving analog input AIN, all channels should generate the same filtered digital values Y1, Y2, Y3, Y4. Differences in these values among channels can indicate skews or timing differences.

Product derivative factors F1, F2, F3, F4 each indicate a digital value or timing difference between a channel and its two adjacent channels. These timing differences are combined with all other timing differences by matrix processor 50 to generate the sign bits. The sign bits indicate which channels have larger delays, and which channels have smaller delays.

Calibrator 55 uses these sign bits during a successive-approximation sequence to decide when to keep a test bit set in SAR delay 42, 43, 44 and when to reset the test bit, as successively smaller bit-positions are tested.

Figure 5:
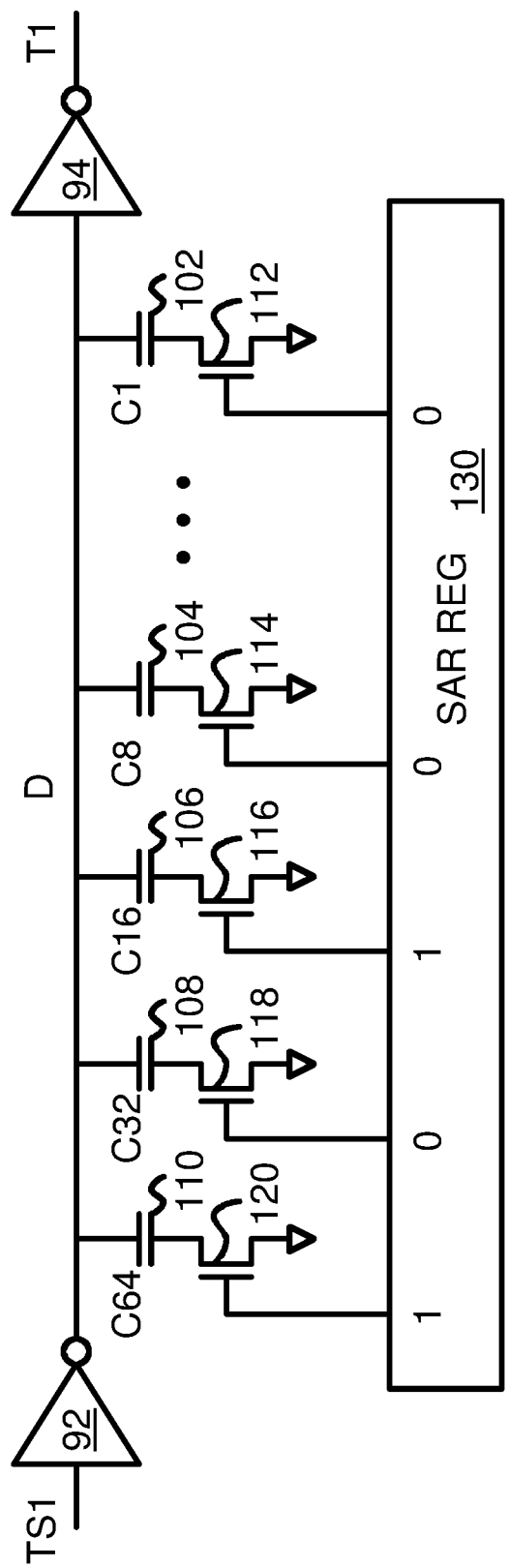
FIG. 5 is a diagram of a SAR delay element with binary-weighted capacitors.

FIG. 5 is a diagram of a SAR delay element with binary-weighted capacitors. SAR delay 40 has input inverter 92 that inverts input sampling clock TS1 to drive delay node D, and output inverter 94 that drives local sampling clock T1 for channel 1.

A series of binary-weighted capacitors 110, 108, 106, 104, ... 102 have capacitance values or weights of 64, 32, 16, 8, 4, 2, and 1 times a minimum capacitor value of C, C1 capacitor 102. All of binary-weighted capacitors 110, 108, 106, 104, ... 102 have one terminal that connects to delay node D between inverters 92, 94, and another terminal connected to ground through enabling transistors 120, 118, 116, 114, ... 112. Bits in SAR register 130 drive the gates of enabling transistors 120, 118, 116, 114, ... 112. When the bit in SAR register 130 is high, the enabling transistor is turned on, connecting the lower terminal of the capacitor to ground, enabling the capacitor and increasing the capacitance and delay of delay node D.

For example, the value 1010000 programmed into SAR register 130 enables transistors 120, 116, and capacitors 110, 106, increasing the capacitance on delay node D by 64 C+16 C, or 80 C. MSB capacitor 110 adds a 64 C delay while capacitor 106 adds a 16 C delay. Other SAR delays 42, 43, 44 operate in a similar manner and can each be programmed with a different SAR delay value.

Figure 6:
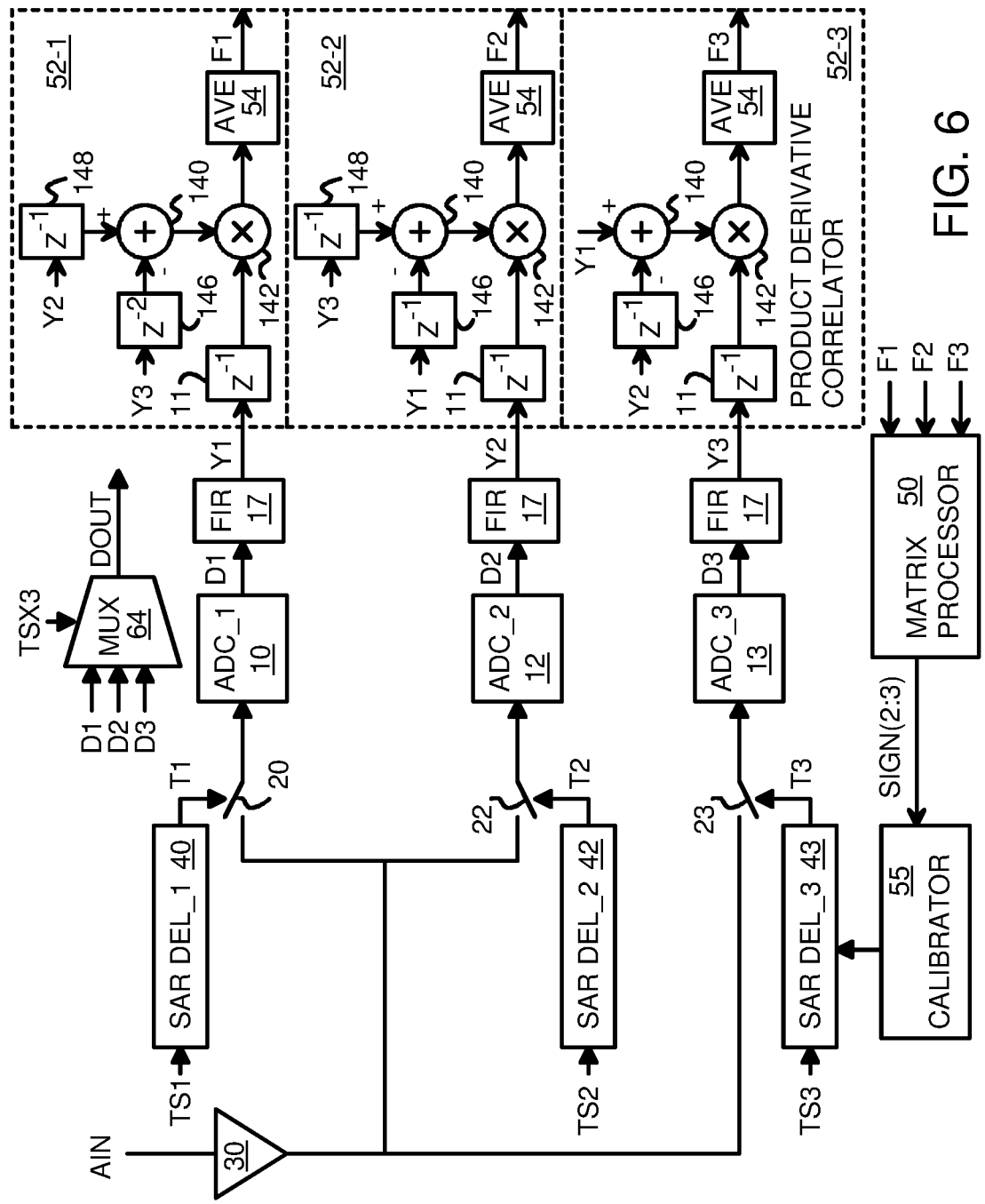
FIG. 6 is a block diagram of a 3-channel interleaved ADC with details of the product derivative correlators that drive a matrix processor for calibration of programmable input delays.

FIG. 6 is a block diagram of a 3-channel interleaved ADC with details of the product derivative correlators that drive a matrix processor for calibration of programmable input delays. In this simplified 3-channel ADC, there are only three ADC 10, 12, 13, three sampling switches 20, 22, 23, three SAR delays 40, 42, 43, and three inputs D1, D2, D3 to mux 64, which operates with clock TSX3.

The three FIR filters 17 generate filtered digital values Y1, Y2, Y3 that are input to product derivative correlators 52-1, 52-2, and 52-3 for channels 1, 2, 3 that generate product derivative factors F1, F2, F3, respectively.

Channel 2 product derivative correlator 52-2 has sample delay 11 delay Y2 before being input to multiplier 142, where its is multiplied by the sum from adder 140, which is Y3 delayed by sample delay 148 minus Y1 delayed by sample delay 146. Averager 54 then generates the average over M analog-input samples to generate product derivative factor F2. Product derivative correlator 52-2 generates the function:

$$F2=\text{Average}\{Y2[n-1]*(Y3[n-1]-Y1[n-1])\}$$

where n is the sample number, from 1 to N, and the average is over N samples. F2 is the average correlation of the current channel Y2 with its adjacent channels Y1, Y3. F2 is a product derivative correlation factor.

In general, for any channel X in an N-channel interleaved ADC, $$F(X)=\text{Average}\{Y(X)[n-1]*(Y(X+1)[n-1]-Y(X-1)[n-1])\}$$

where X+1 and X−1 are performed modulo N, so that first channel 1 has Y(X−1)=Y(N)=Y3 input to sample delay 146, which delays by 2 samples ($Z^{-2}$) in product derivative correlator 52-1, while last channel 3 has Y(X+1)=Y(1)=Y1 input directly to adder 140, bypassing sample delay 148 in product derivative correlator 52-3. When modulo wrapping, the sample number is also increased or decreased by 1.

First channel (X=1) product derivative correlator 52-1 generates:

$$F(1)=\text{Average}\{Y(1)[n-1]*(Y(2)[n-1]-Y(N)[n-2])\}$$

since X−1 modulo N wraps back to N, the last channel.

Last channel (X=N) product derivative correlator 52-3 generates:

$$F(N) = \text{Average}\{Y(N)[n-1]*(Y(1)[n]-Y(N-1)[n-1])\}$$

since X+1 modulo N wraps forward to channel 1.

product derivative factors F1, F2, F3, F4 are combined and arranged into a matrix F:

$$F = \begin{bmatrix} F_1 \\ F_2 \\ \cdot \\ \cdot \\ \cdot \\ F_{N-1} \\ F_N \end{bmatrix} = \begin{bmatrix} \overline{Y_1[n-1](Y_2[n-1]-Y_N[n-2])} \\ \overline{Y_2[n-1](Y_3[n-1]-Y_1[n-1])} \\ \cdot \\ \cdot \\ \cdot \\ \overline{Y_{N-1}[n-1](Y_N[n-1]-Y_{N-2}[n-1])} \\ \overline{Y_N[n-1](Y_1[n]-Y_{N-1}[n-1])} \end{bmatrix}$$

The correlation matrix is based on the shift matrix C, which is a square N×N matrix with N rows and N columns:

$$C = \begin{bmatrix} -1 & 0 & 0 & 0 & 0 & \ldots & 0 & 0 & -1 \\ 2 & -1 & 0 & 0 & 0 & \ldots & 0 & 0 & 0 \\ -1 & 2 & -1 & 0 & 0 & \ldots & 0 & 0 & 0 \\ 0 & -1 & 2 & -1 & 0 & \ldots & 0 & 0 & 0 \\ & & & & \vdots & & & & \\ & & & & \vdots & & & & \\ 0 & 0 & 0 & 0 & 0 & \ldots & -1 & 2 & -1 \\ 0 & 0 & 0 & 0 & 0 & \ldots & 0 & -1 & 2 \end{bmatrix}$$

The correlation matrix is the transpose of C, $C^T$, divided by the product of the transpose of C, $C^T$, and C, or:

$$\frac{C^T}{C^T C} = INV(C^T C) C^T$$

Alternately, the inverse matrix INV of ($C^T*C$) may be multiplied by $C^T$.

Matrix processor 50 generates the sign bits for channels 2 through N by multiplying matrix F by the correlation matrix:

$$([\text{sign}(2)\text{sign}(3)\ldots\text{sign}(N)]^T) = -\text{sign}\left(\frac{C^T}{C^T C} F\right)$$

Since the shift matrix C is a constant that only depends on its size N, the adjacent channel correlation results from product derivative factors [F1, F2, F3, FN] is a variable that is multiplied by a constant to generate the sign bits. Sign bits sign(2), sign(3), . . . sign(N) form a 1-diemsional matrix or a vector, and can be transposed from a vertical 1×N matrix to a horizontal N×1 matrix for easier processing or data storage.

At the start of calibration SAR delay 40 is set with a fixed delay value, such as a mid-point value of 10000 . . . 0, while SAR delays 42, 43 have bits set and cleared by calibrator 55 during a SAR routine. When sign bit sign(2) generated by matrix processor 50 is high, calibrator 55 sets high the bit in SAR delay 42, but when sign bit sign(2) is low, calibrator 55 clears low the bit in SAR delay 42. Likewise, when sign bit sign(3) generated by matrix processor 50 is high, calibrator 55 sets high the bit in SAR delay 43, but when sign bit sign(3) is low, calibrator 55 clears low the bit in SAR delay 43.

Figure 7A:
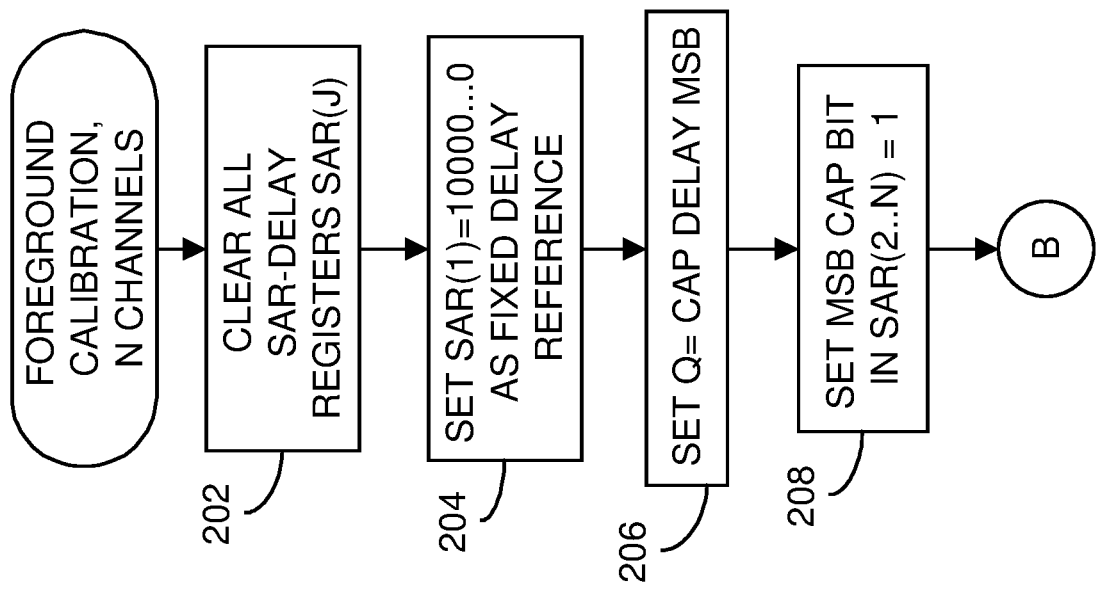
FIGS. 7A-7B is a flowchart of foreground calibration of N ADC channels interleaved together.
Figure 7B:
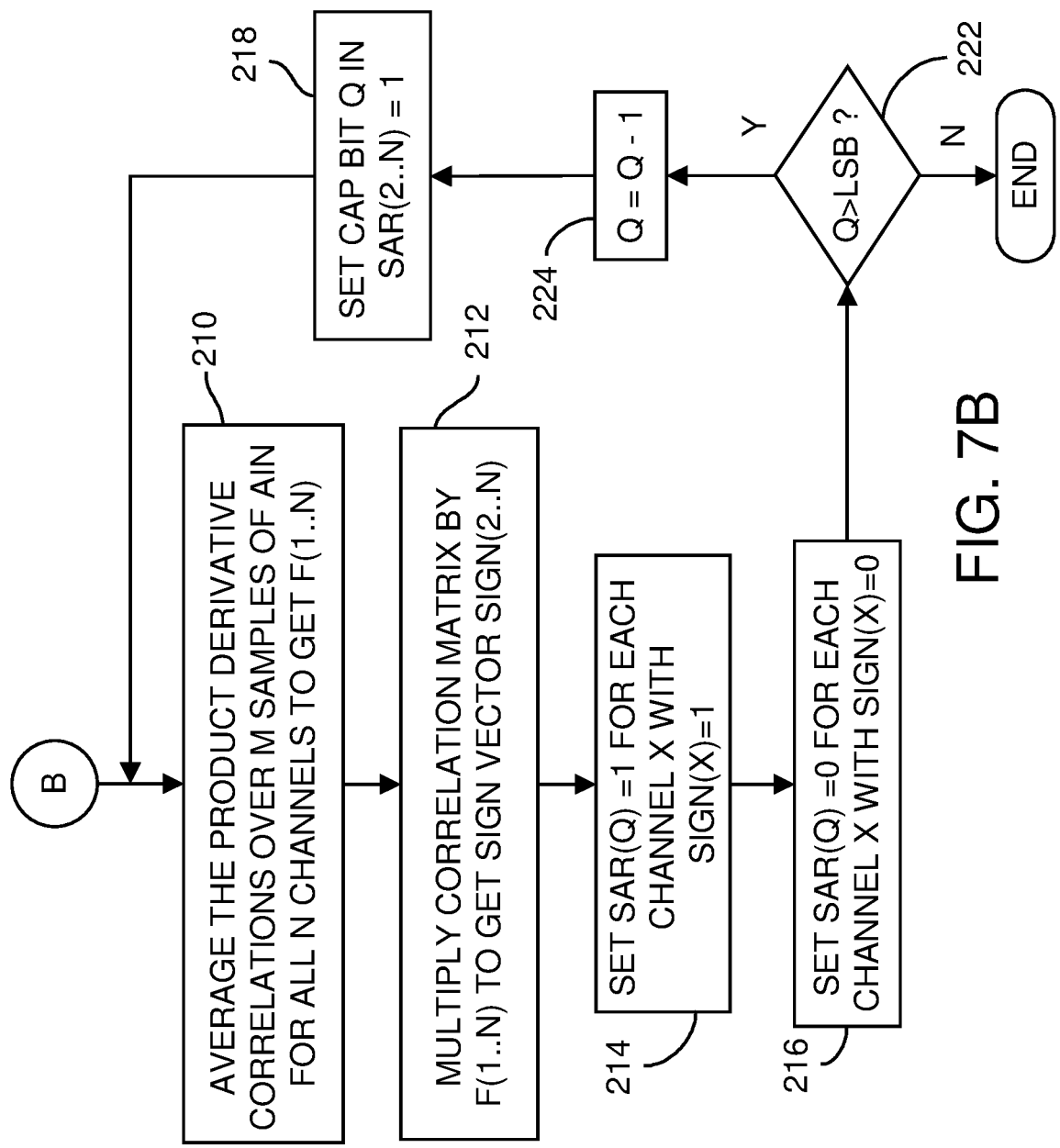

FIGS. 7A-7B is a flowchart of foreground calibration of N ADC channels interleaved together. This process can be used to initially calibrate the 4-way interleaved ADC of FIG. 4, the 3-way interleaved ADC of FIG. 6, the 6-way interleaved ADC of FIG. 11, the 7-way interleaved ADC of FIG. 12, or any arbitrary N-way interleaved ADC, where N is a whole number of at least 3.

All bits in all of SAR delay 40, 42, 43, 44 are cleared for initialization for all arbitrary channels J, SAR(J), step 202. SAR delay 40 for the first channel, SAR(1), is set to the midpoint value of 1000 . . . 0, step 204. The first channel acts as a fixed timing reference for correlation with the other channels, so SAR(1) remains fixed for the rest of foreground calibration. The other channels have bits in their SAR(J) set or cleared during calibration.

The current bit-position Q in SAR delays 42, 42, 44, SAR(J), is set to the MSB of the variable delay or variable capacitor, step 206. This MSB bit Q=MSB is set in SAR (J=2 . . . N) for each of the remaining N−1 channels, step 208.

In FIG. 7B, product derivative correlators 52 generate product derivative factors F1, F2, F3, F4, . . . FN that are each the average correlation to adjacent channels over M samples, step 210. Matrix processor 50 arranges product derivative factors F1, F2, F3, F4, . . . FN into a matrix F and multiples it by the correlation matrix, $C^T/(C^T*C)$, step 212. The result from matrix processor 50 is sign vector sign (2 . . . N). This sign vector has one sign bit for each of channels 2 to N. Each sign bit indicates the sign of the correlated delay difference for that channel relative to the first channel.

When the sign bit for a channel X is 1, step 214, then calibrator 55 keeps SAR(Q) high for that channel. The added delay in SAR delay 42, 43, 44 was not large enough. SAR(Q) is the corresponding bit in SAR delay 42, 43, 44 for bit-position Q.

When the sign bit for a channel X is 0, step 216, then calibrator 55 clears SAR(Q) to 0 for that channel. The added delay in SAR delay 42, 43, 44 was too large.

When Q has not yet reached the LSB, step 222, then Q is decremented, step 224, and the next significant bit Q in SAR delay 42, 43, 44 is set, step 218. Next in step 210, product derivative correlators 52 generate new values of product derivative factors F1, F2, F3, F4, . . . Fn using the new delay values in SAR delay 42, 43, 44 set by calibrator 55 in step 218. Matrix processor 50 generates new sign bits, step 212, and calibrator 55 clears any bits that have zero sign bits, step 216.

This process repeats for successively smaller Q bit-positions and smaller added capacitances in steps 210-224 until Q reaches the LSB, step 222, when calibration ends.

Figure 1:
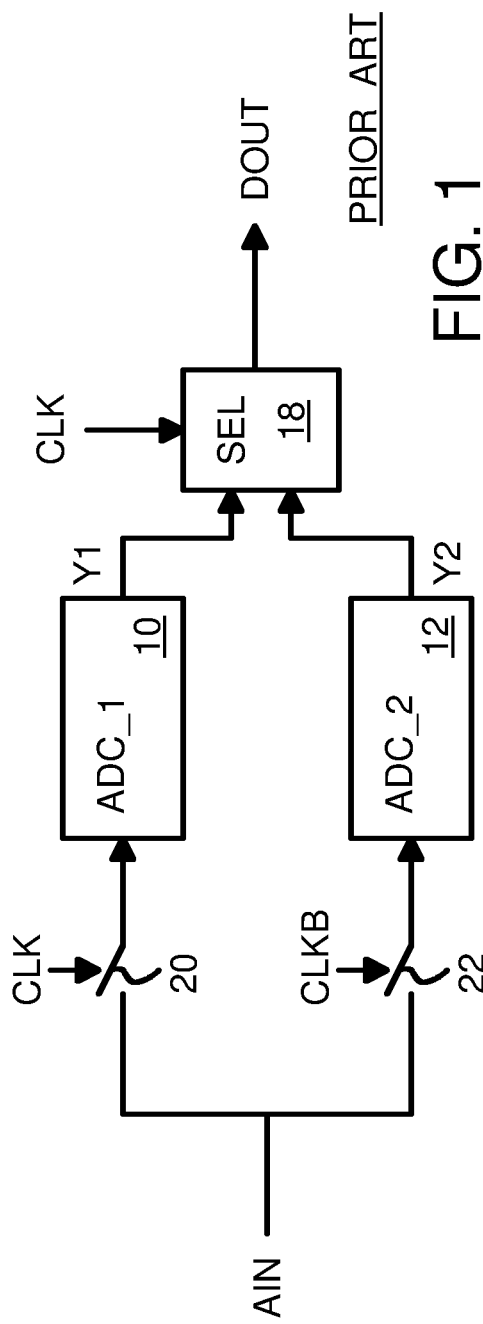
FIG. 1 shows a prior-art interleaved ADC.
Figure 2:
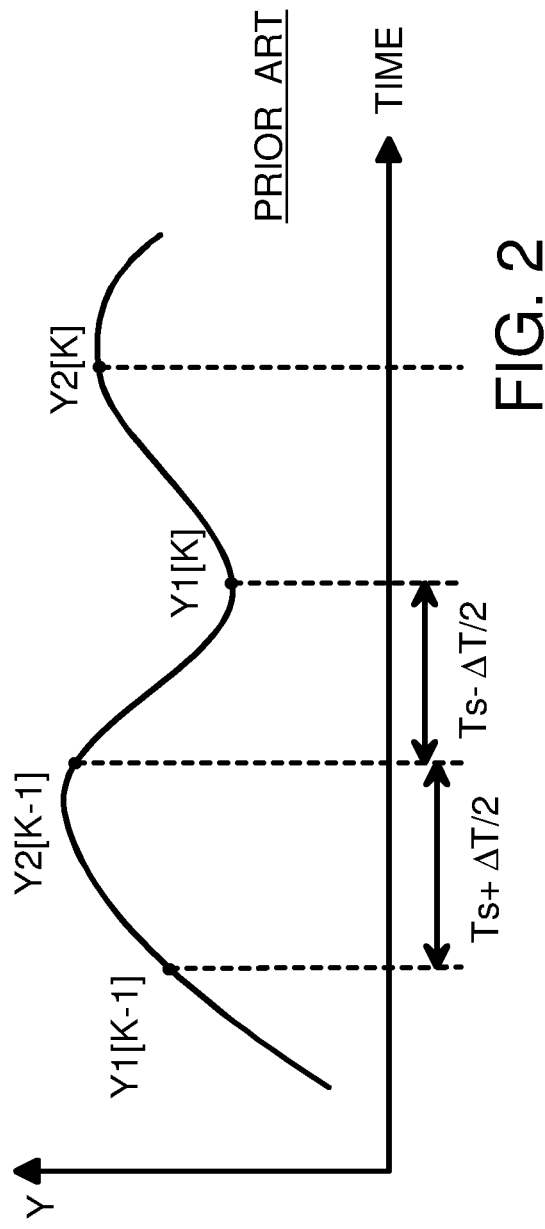
FIG. 2 is a graph of analog sampling and clock skew.
Figure 3:
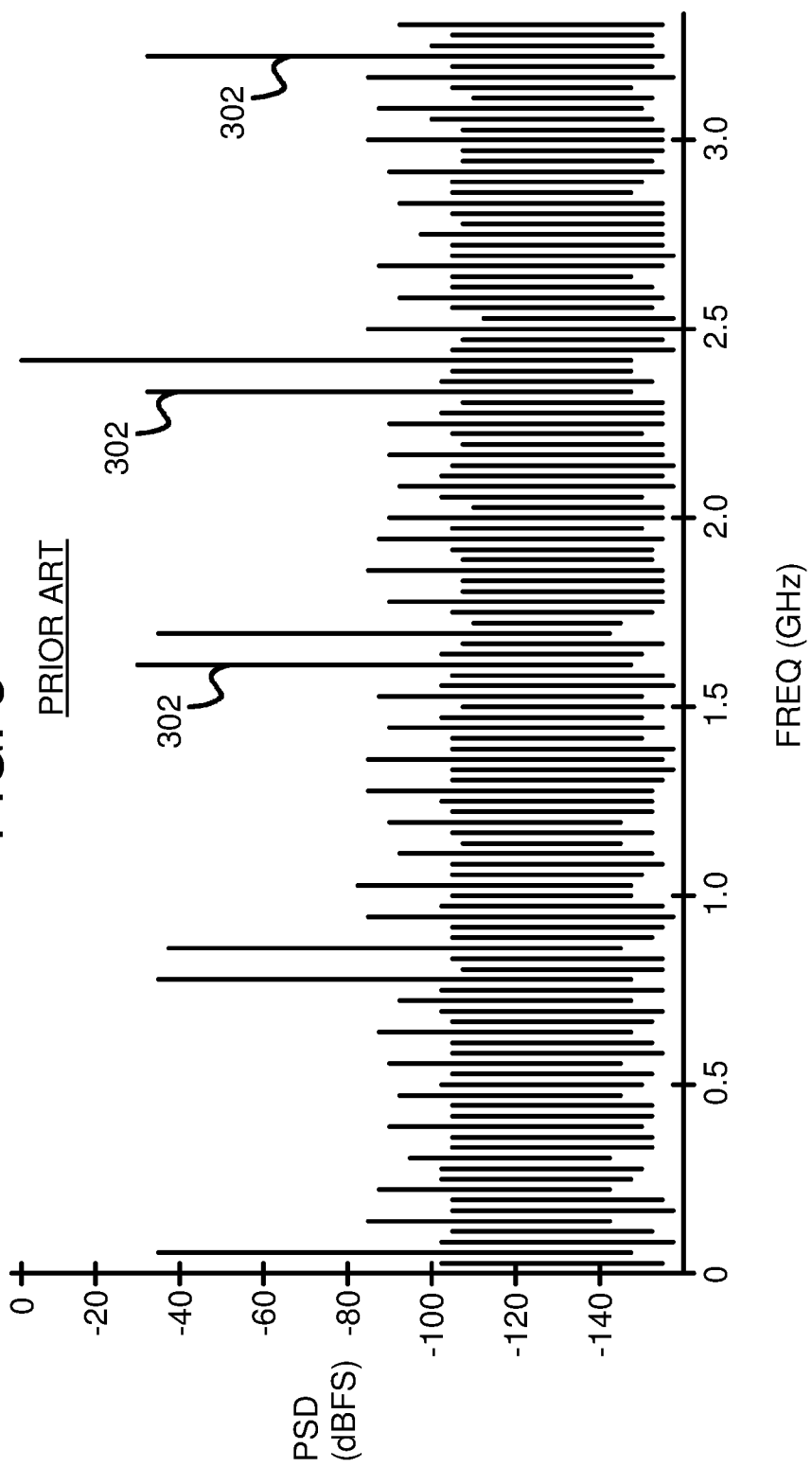
FIG. 3 is a graph of spurious tones in a spectrum for a prior-art interleaved ADC.

FIG. 8 is a graph of reduced spurious tones in a spectrum for an interleaved ADC with channel input delays calibrated by product derivative correlators and matrix processing. Sampling pulse-width mismatches and component mismatches that introduce non-linearities or errors are compensated for by the calibration routine of FIGS. 7A-7B adjusting the programmable delays in SAR delay 40, 42, 43, 44 in the interleaved ADC shown in FIG. 4. This calibration reduces the amplitude of spurious tones 303. These spurious tones still occur at integer multiples of Fs/N, K*Fs/N±Fin, where Fs is the sampling frequency (period Ts=1/Fs) and N is the number of channels interleaved together. However, the amplitude of spurious tones 303 are reduced when compared with spurious tones 302 of the prior-art of FIG. 3.

Figure 9:
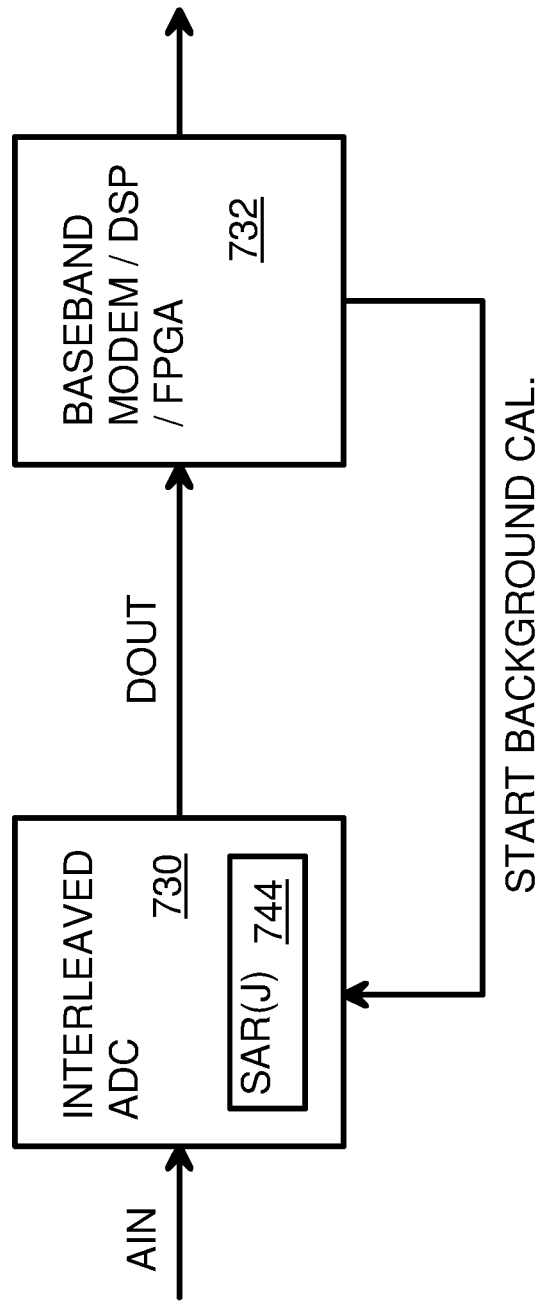
FIG. 9 shows a backend processor triggering background calibration of an interleaved ADC.

FIG. 9 shows a backend processor triggering background calibration of an interleaved ADC. Foreground calibration, such as shown in FIGS. 7A-7B, can be triggered on power-up, initialization, or a reset. This foreground calibration uses product derivative correlators and a matrix processor with calibrator 55 to perform Successive-Approximation searches that load delay values into SAR delay registers 744 in interleaved ADC 730 to compensate for timing skews among ADC channels in interleaved ADC 730.

Temperature and voltage conditions can drift over time. Switches, delays, ADCs, and other components and their errors can be temperature and voltage dependent. The circuitry in interleaved ADC 730 is sensitive to temperature and voltage. Over time, as the system heats up or as the environment changes, temperature and supply-voltage changes may cause increased timing skews in interleaved ADC 730. As conditions drift, the calibrated delays may need to be updated to compensate for this drift. Background calibration can be triggered periodically to compensate for these drifts.

Downstream device 732 could be a baseband modem, a Digital Signal Processor (DSP), a Field-Programmable Logic Array (FPGA), or other device that uses the digital output DOUT from interleaved ADC 730. Downstream device 732 may include logic that detects when temperature, voltage, or other conditions have changed and trigger interleaved ADC 730 to perform background calibration. Downstream device 732 could have a timer and trigger background calibration after some period of time, such as hourly or daily. Downstream device 732 could detect idle times or times when the analog input AIN has a suitable signal strength and frequency for calibration. Pattern-generation logic integrated with interleaved ADC 730 may also be enabled to generate suitable analog input AIN signals for calibration.

Figure 10B:
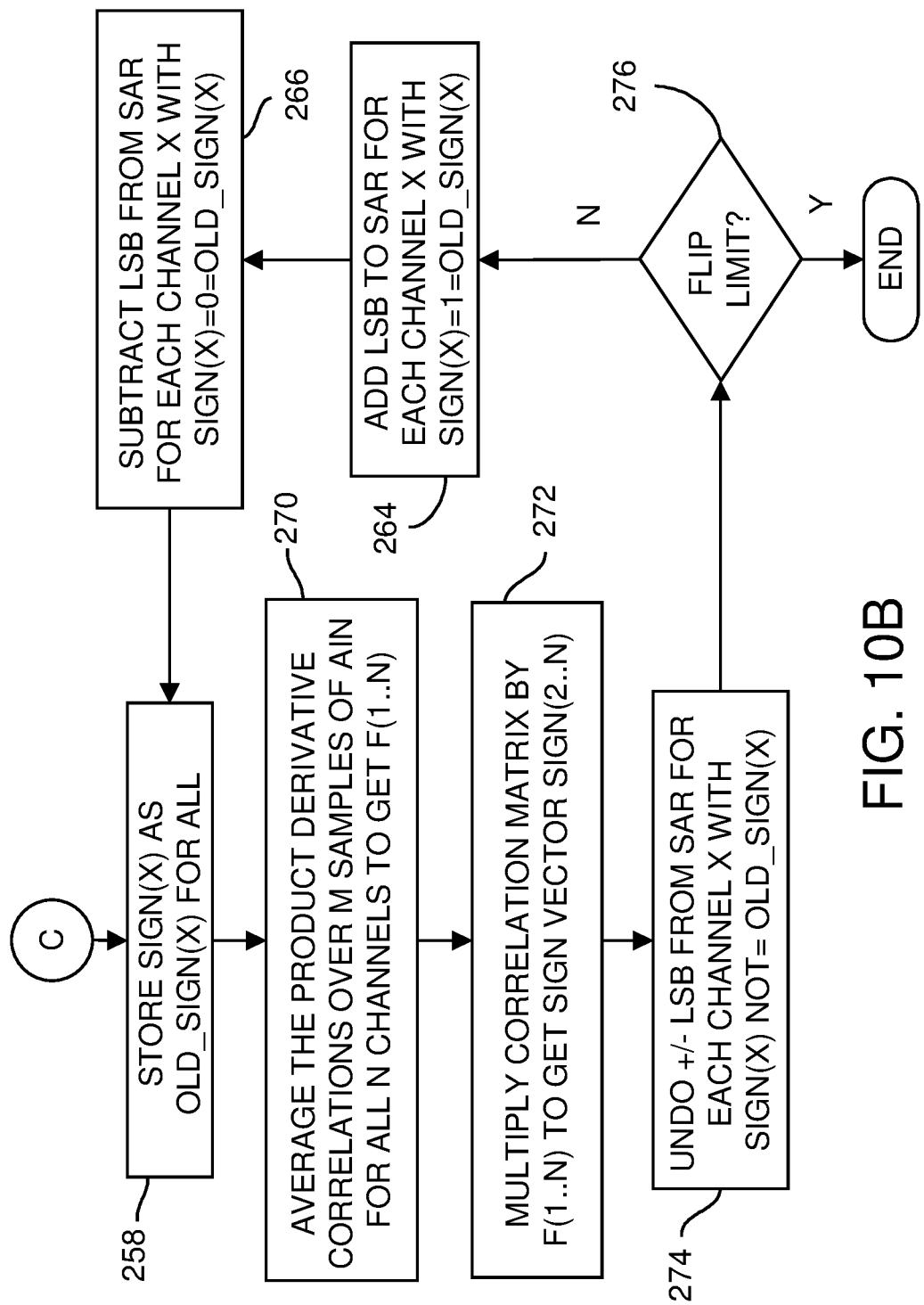

FIGS. 10A-10B show a flowchart of a background calibration process. Background calibration is performed after foreground calibration has completed and calibrated delays are loaded into all of SAR delay 40, 42, 43, 44, . . . SAR(J) and re-used, step 252.

Product derivative correlators 52 generate product derivative factors F1, F2, F3, F4, . . . FN that are each the average correlation to adjacent channels over M samples, step 260. Matrix processor 50 arranges product derivative factors F1, F2, F3, F4, . . . FN into a matrix F and multiples it by the correlation matrix, $C^T/(C^T*C)$, step 262. The result from matrix processor 50 is sign vector sign(2 . . . N). This sign vector has one sign bit for each of channels 2 to N.

When the sign bit for a channel X is 1, step 254, then calibrator 55 adds one LSB to the delay value in SAR delay 42, 43, 44 for that channel X. The added delay in SAR delay 42, 43, 44 was not large enough.

When the sign bit for a channel X is 0, step 256, then calibrator 55 subtracts one LSB from the SAR delay value SAR(X) for that channel. The added delay in SAR delay 42, 43, 44 was too large.

In FIG. 10B, the sign vector sign(2 . . . N) is stored as the old sign vector old sign(2 . . . N), step 258. Product derivative correlators 52 again generate product derivative factors F1, F2, F3, F4, . . . FN that are each the average correlation to adjacent channels over M samples, step 270. Matrix processor 50 once again arranges product derivative factors F1, F2, F3, F4, . . . FN into a matrix F and multiples it by the correlation matrix, $C^T/(C^T*C)$, step 272. The result from matrix processor 50 is the new sign vector sign( . . . N).

When the sign bit for a channel X has changed, so that sign(X) is not equal to old sign(X), step 274, then the LSB either added in step 254 or subtracted in step 256 is removed, such as by subtracting one LSB or adding one LSB, or by re-loading the prior value in SAR(X) before the last loop. A flip indicator for that channel X is incremented when the sign bit changes.

When a flip limit is not yet reached, step 276, then another loop begins. When the sign bit for a channel X is 1, and the old sign bit old sign(X) was also 1, step 264, then calibrator 55 adds one LSB to the delay value in SAR delay 42, 43, 44 for that channel X.

When the sign bit for a channel X is 0, and the old sign bit old sign(X) was also 0, step 266, then calibrator 55 subtracts one LSB from the SAR delay value SAR(X) for that channel. Then steps 258, 270, 272, 274 are repeated.

When a flip limit is reached, step 276, the background calibration process ends. The flip limit can be when each of the channels has flipped in each of the last FL loops or can require that the majority of the channels have flipped in each of the last FL loop, or to some other endpoint condition. For example, FL could be 20. When the endpoint is reached, each loop iteration successively adds and removes the LSB in each channel's SAR, indicating that a steady-state has been reached and further iterations do not result in better skew matching. The flip limit FL can be set to as little as 1, or to a larger value for better robustness.

The MSB is used for foreground calibration when large changes in delay are desirable to converge on the calibration result more rapidly. However the LSB is used for background calibration, since the drift is not expected to be large, so slower adjustments are more desirable for background calibration.

Figure 11:
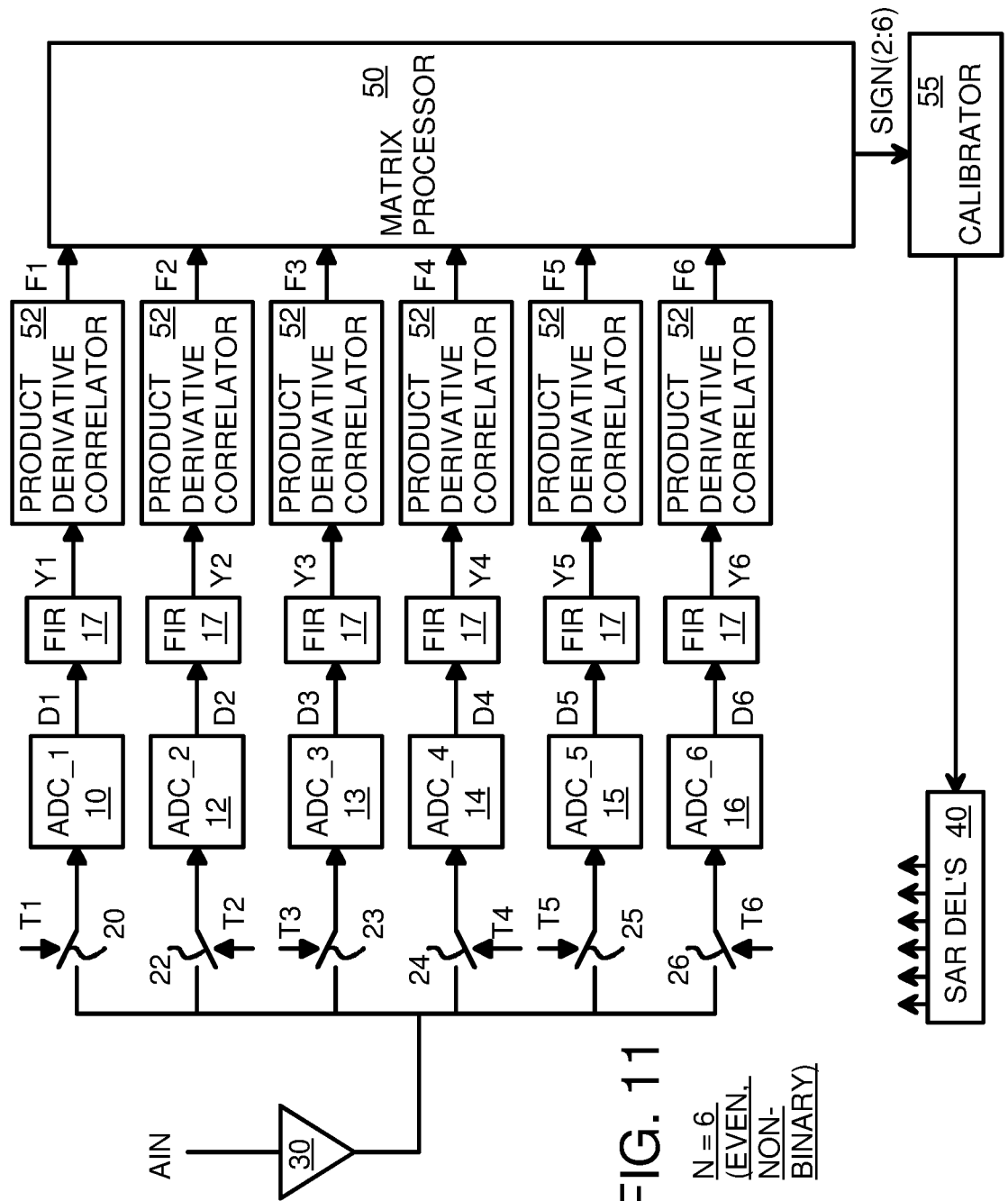
FIG. 11 shows a non-binary number of ADCs interleaved and calibrated with product derivative correlators and a matrix processor.

FIG. 11 shows a non-binary number of ADCs interleaved and calibrated with product derivative correlators and a matrix processor. While a binary number of channels is very efficient, there may be a non-binary number of ADC channels N. For example, there may be N=6 ADC channels that generate filtered outputs Y1, Y2, Y3, . . . Y6 from FIR filters 17. Switches 20-26 sample the analog input to ADC 10-16, which are filtered by FIR filters 17 and drive six product derivative correlators 52. Six product derivative correlators 52 generate product derivative factors F1, F2, F3, F4, F5, F6 that form a matrix that is multiplied by the correlation matrix in matrix processor 50 to generate sign bit vector sign(2 . . . 6) that controls calibrator 55 adjusting delay values in SAR delay 40.

For N=6 channels, F is:

$$F = \begin{cases} E[Y1[n-1](Y2[n-1] - Y6[n-2])] \\ E[Y2[n-1](Y3[n-1] - Y1[n-1])] \\ E[Y3[n-1](Y4[n-1] - Y2[n-1])] \\ E[Y4[n-1](Y5[n-1] - Y3[n-1])] \\ E[Y5[n-1](Y6[n-1] - Y4[n-1])] \\ E[Y6[n-1](Y1[n] - Y5[n-1])] \end{cases}$$

The correlation matrix is $C^T/(C^T*C)$, where C is:

$$C = \begin{bmatrix} -1 & 0 & 0 & 0 & -1 \\ 2 & -1 & 0 & 0 & 0 \\ -1 & 2 & -1 & 0 & 0 \\ 0 & -1 & 2 & -1 & 0 \\ 0 & 0 & -1 & 2 & -1 \\ 0 & 0 & 0 & -1 & 2 \end{bmatrix}$$

Other non-binary even values of N could be substituted and the system adjusted as needed.

Figure 12:
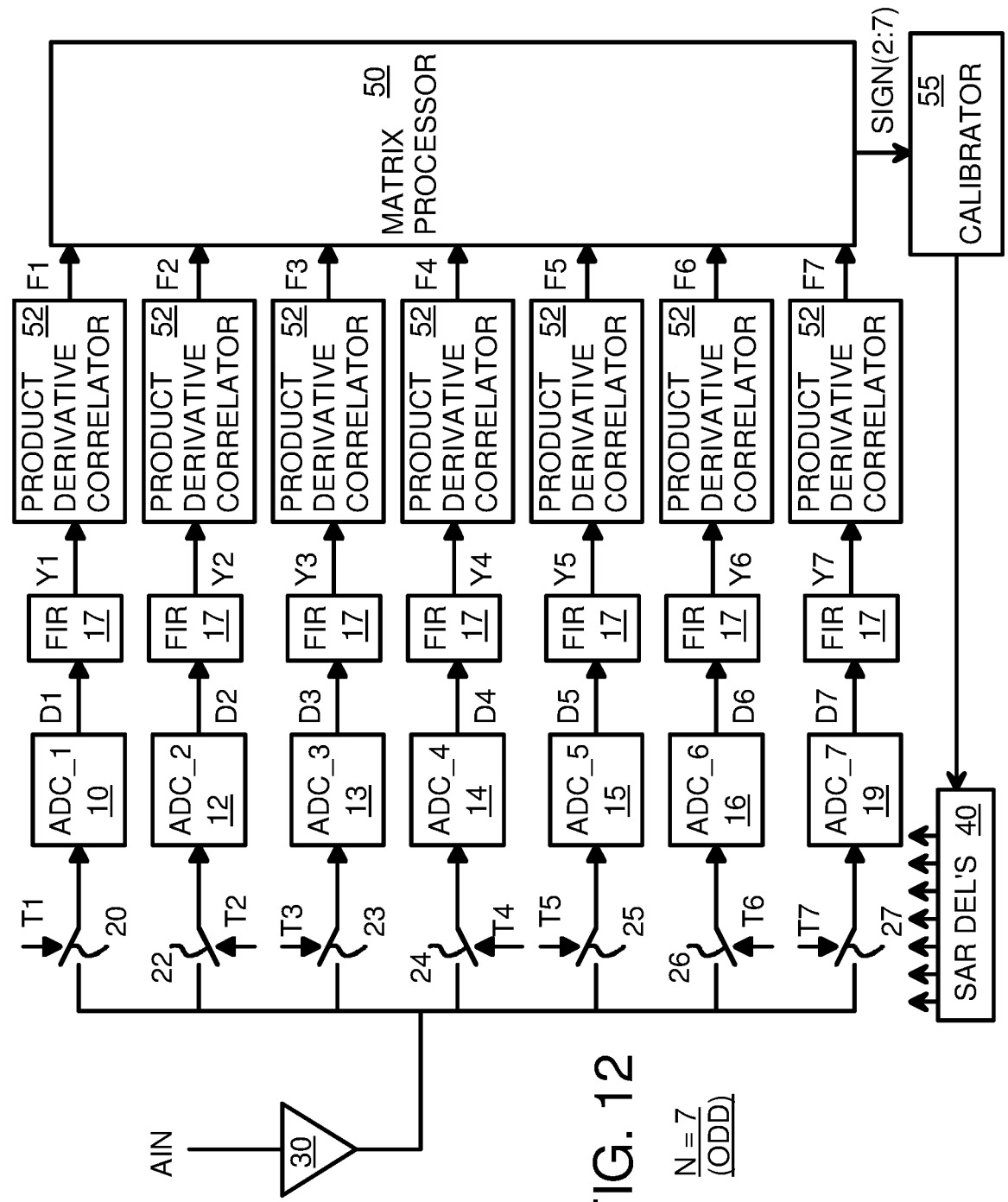
FIG. 12 shows a non-binary odd number of ADCs interleaved and calibrated with product derivative correlators and a matrix processor.

FIG. 12 shows a non-binary odd number of ADCs interleaved and calibrated with product derivative correlators and a matrix processor. In this alternative, there are and odd number N=7 ADC channels that generate filtered outputs Y1, Y2, Y3, . . . Y7. Switches 20-27 sample the analog input to ADC 10-16, 19, which are filtered by FIR filters 17 and drive seven product derivative correlators 52.

Seven product derivative correlators 52 generate product derivative factors F1, F2, F3, F4, F5, F5, F6, F7 that form a matrix that is multiplied by the correlation matrix in matrix processor 50 to generate sign bit vector sign(2 . . . 7) that controls calibrator 55 adjusting delay values in SAR delay 40.

For N=7 channels, F is:

$$F = \begin{cases} E[Y1[n-1](Y2[n-1]-Y7[n-2])] \\ E[Y2[n-1](Y3[n-1]-Y1[n-1])] \\ E[Y3[n-1](Y4[n-1]-Y2[n-1])] \\ E[Y4[n-1](Y5[n-1]-Y3[n-1])] \\ E[Y5[n-1](Y6[n-1]-Y4[n-1])] \\ E[Y6[n-1](Y7[n-1]-Y5[n-1])] \\ E[Y7[n-1](Y1[n]-Y6[n-1])] \end{cases}$$

the correlation matrix is $C^T/(C^T*C)$, where C is:

$$C = \begin{bmatrix} -1 & 0 & 0 & 0 & 0 & -1 \\ 2 & -1 & 0 & 0 & 0 & 0 \\ -1 & 2 & -1 & 0 & 0 & 0 \\ 0 & -1 & 2 & -1 & 0 & 0 \\ 0 & 0 & -1 & 2 & -1 & 0 \\ 0 & 0 & 0 & -1 & 2 & -1 \\ 0 & 0 & 0 & 0 & -1 & 2 \end{bmatrix}$$

Other odd non-binary values of N could be substituted and the system adjusted as needed.

Mathematical Derivation of Matrix Formulas

Shown below is a mathematical derivation of the formulas implemented by product derivative correlators 52 and matrix processor 50 to generate the sign bit vector used for the SAR routine decisions.

An autocorrelation function is defined as:

$$R = E[Yi[n]Tj[n]]$$

Herein $\Delta T_i$ denotes the timing skew mismatch in a channel i relative to a reference channel. If $\Delta T_1$, $\Delta T_2$, $\Delta T_3$, $\Delta T_4$ are small compared to Ts, then $1^{st}$ order Taylor Series can be approximated as $$E = [Y1[n]Y1'[n]] = E[Y1[nTs+\Delta T_1](Y2[nTs+\Delta T_2]-Y4[(n-1)nTs+\Delta T_4])]$$

$$\approx R_Y(Ts+\Delta T_2-\Delta T_1) - R_Y(Ts-\Delta T_4+\Delta T_1)$$

$$\approx (\Delta T_2 - \Delta T_1)\frac{\partial R_Y}{\partial \tau} - (-\Delta T_4 + \Delta T_1)\frac{\partial R_Y}{\partial \tau}$$

$$= (-2\Delta T_1 + \Delta T_2 + \Delta T_4)\frac{\partial R_Y}{\partial \tau}$$

$$= -[2 \quad -1 \quad 0 \quad -1][\Delta T_1 \quad \Delta T_2 \quad \Delta T_3 \quad \Delta T_4]^T \frac{\partial R_Y}{\partial \tau}$$

For 4 channel, we can generalize the following product derivative vectors $$F = \begin{cases} E[Y1[n]Y1'[n]] \\ E[Y2[n]Y2'[n]] \\ E[Y3[n]Y3'[n]] \\ E[Y4[n]Y4'[n]] \end{cases}$$

An Matrix C for timing skew error is generalized as $$C = \begin{bmatrix} 2 & -1 & 0 & -1 \\ -1 & 2 & -1 & 0 \\ 0 & -1 & 2 & -1 \\ -1 & 0 & -1 & 2 \end{bmatrix}$$

Therefore, all related to this equation $$F = -C[\Delta T_1 \quad \Delta T_2 \quad \Delta T_3 \quad \Delta T_4]^T \frac{\partial R_Y}{\partial \tau}$$

To solve this equation, we need to fix one timing skew error to be zero by removing first column of C $$C = \begin{bmatrix} -1 & 0 & -1 \\ 2 & -1 & 0 \\ -1 & 2 & -1 \\ 0 & -1 & 2 \end{bmatrix}$$

Without loss of generality, vector $\Delta T$ can be resolved as $$[\Delta T_2 \quad \Delta T_3 \quad \Delta T_4]^T = -\frac{1}{\frac{\partial R_Y}{\partial \tau}} \frac{C^T}{C^T C} F$$

The sign value of the above equation provides the calibration direction to converge min. vector $\Delta T$ $$\text{sign}([\Delta T_2 \quad \Delta T_3 \quad \Delta T_4]^T) = -\text{sign}\left(\frac{1}{\frac{\partial R_Y}{\partial \tau}} \frac{C^T}{C^T C} F\right)$$

Since derivative of autocorrelation has fixed polarity over Nyquist bandwidth, then we can simply the calibration equation into $$\text{sign}([\Delta T_2 \quad \Delta T_3 \quad \Delta T_4]^T) = -\text{sign}\left(\frac{C^T}{C^T C} F\right)$$

Theoretical Model of Interleaved ADC

Figure 13:
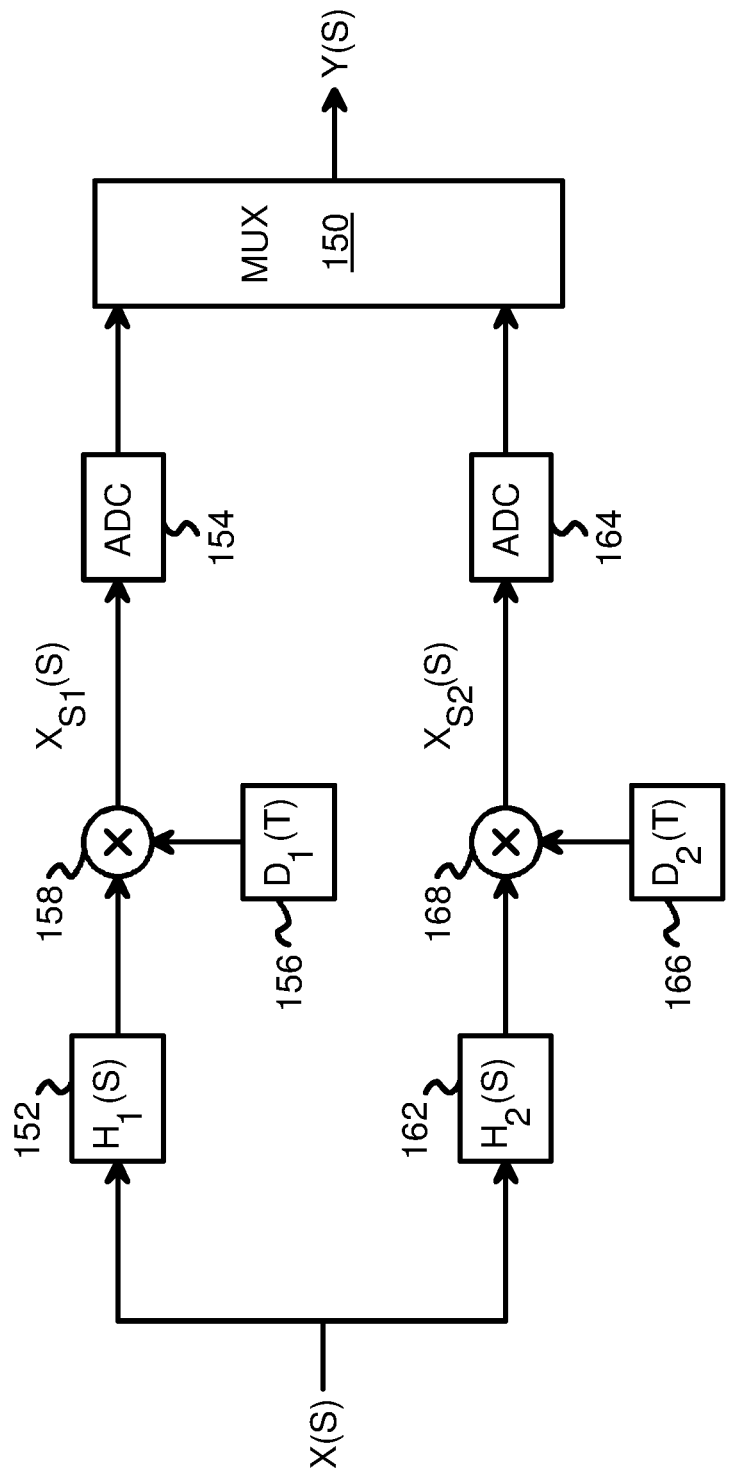
FIG. 13 shows a model of an interleaved ADC.

FIG. 13 shows a model of an interleaved ADC. An analog input X(S) is sampled by first sampler 152 as function $H_1(S)$, which is multiplied by first multiplier 158 with first delay 156 $D_1(T)$ to generate $X_{S1}(S)$ that is input to first ADC 154. In the second channel, analog input X(S) is also sampled by second sampler 162 as function $H_2(S)$, which is multiplied by second multiplier 168 with second delay 166 $D_2(T)$ to generate $X_{S2}(S)$ that is input to second ADC 164. The digital outputs of first ADC 154 and second ADC 164 are muxed together by mux 150 to generate output Y(S).

The following equations and discussion are presented as a theoretical background and is not intended to limit the invention or its claims but are presented for edification.

Assuming a single-pole sampling system, sampled analog signal (odd) and (even) are given by:

$$X_{S1}(s) = H_1(s) \times \left[\frac{1}{T_s}\sum_{k=-\infty}^{\infty} X\left(j\left(\omega - \frac{2\pi k}{T_s}\right)\right)\right]$$

$$X_{S2}(s) = H_2(s) \cdot e^{-j2\pi k\frac{\Delta T}{T_s}} \times \left[\frac{1}{T_s}\sum_{k=-\infty}^{\infty} X\left(j\left(\omega - \frac{2\pi k}{T_s}\right)\right)\right] e^{-jk\pi}$$

Therefore, digital output Y(s) is given by:

$$Y(s) = X_{S1}(s) + X_{S2}(s)$$
$$= \left[\frac{1}{T_s}\sum_{k=-\infty}^{\infty} X\left(j\left(\omega - \frac{2\pi k}{T_s}\right)\right)\right] \times \left[H_1(s) + e^{-jk\pi}H_2(s) \cdot e^{-j2\pi k\frac{\Delta T}{T_s}}\right]$$

Ideally, if $H_1(s) = H_2(s) = H(s)$ and $\Delta T = 0$, then $$Y_{ideal}(s) = \frac{1}{T'_s}\sum_{n=-\infty}^{\infty} X\left(j\left(\omega - \frac{2\pi n}{T'_s}\right)\right) \text{ where } T'_s = \frac{T_s}{2}$$

Odd image replica from $H_2(s)$ is well-cancelled with $H_1(s)$, in other words, bandwidth of X(s) could be double due to ping-pong sampling system as expected. However, error image (i.e. uncorrected odd image replica) exists in reality due to $H_1(s) \neq H_2(s)$ if $\Delta T \neq 0$.

Herein, we would like to approximate the error due to finite bandwidth mismatch and timing skew as below:

$$Y(s) = Y_{ideal}(s) + E_Y(s) = Y_{ideal}(s) + Y_{ideal}(s) \times \left[H_1(s) - H_2(s) \cdot e^{-j2\pi m\frac{\Delta T}{T_2}}\right]$$

where m is odd #.

This provides the basis analysis on the effect of "dynamic error" in the proposed ADC system. Our target is to evaluate the frequency response of E(s), basically, exponential term can be generalized into:

$$e^{-j2\pi\frac{\Delta T}{T_2}} \rightarrow e^{-s\Delta T}$$

Consequently, equivalent frequency response of two sampling systems converges into $$E(s) = H'_1(s) - H'_2(s)$$

Consider the case in ping-pong sampling with mismatches, we have the following:

$$H'_1(s) = \frac{1}{1 + \frac{s}{\omega_o}}$$

$$H'_2(s) = \frac{e^{-s\Delta T}}{1 + \frac{s}{\omega_o + \Delta\omega}}$$

where $\Delta t$ denotes the timing skew mismatch in channel 2 relative to channel 1, $\Delta w$ denotes the finite bandwidth mismatch in channel 2 relative to channel 1.

Equivalently, it becomes:

$$H'_1(s) = \frac{1}{1 + \frac{s}{\omega_o}}$$

and $$H'_2(s) = \frac{e^{-s\Delta T}}{1 + \frac{s}{\omega_o\left(1 + \frac{\Delta\omega}{\omega_o}\right)}}$$

Herein, we exclude the effect of gain mismatches on $H_1'(s)$ and $H_2'(s)$ because it is not input freq. dependent if cross products terms are negligible compared to fundamental terms.

Consider the "Dynamic Error" E(s), i.e.

$$E(s) = H'_1(s) - H'_2(s)$$

Equivalently, neglecting cross product terms, it becomes:

$$E(s) \approx -\left(\frac{\omega_o}{s + \omega_o}\right)\left[\frac{s}{s + \omega_o}\frac{\Delta\omega}{\omega_o} - \left(1 + \frac{\Delta\omega}{\omega_o}\right)s\Delta T\right] \approx$$

$$-\left(\frac{1}{1 + \frac{s}{\omega_o}}\right)\left[s\underbrace{\left(\frac{1}{1 + \frac{s}{\omega_o}}\right)\left(\frac{1}{\omega_o}\right)\left(\frac{\Delta\omega}{\omega_o}\right)}_{E_{bw}(s)}\underbrace{(-s\Delta T)}_{E_{sk}(s)}\right]$$

$E_{bw}(s)$ and $E_{sk}(s)$ account the effect of finite bandwidth and timing-skew mismatches, respectively.

Clearly, if both $\Delta\omega = 0$ and $\Delta T = 0$, dynamic errors caused by finite bandwidth mismatch and timing skew is zero, respectively.

However, dynamic error always exists and therefore calibration is required to fulfill the target performance. As a result, the time derivatives for the dynamic error is of interest in our case. Consider the following:

$$E_{sk}(s) \approx \frac{s\Delta t}{1 + \frac{s}{\omega_o}} = \left[s - s\left(\frac{s}{\omega_o}\right) + s\left(\frac{s}{\omega_o}\right)^2 - s\left(\frac{s}{\omega_o}\right)^3 + \ldots\right]\Delta T$$

$$E_{bw}(s) \approx -s\left(\frac{1}{1 + \frac{s}{\omega_o}}\right)^2\left(\frac{\Delta\omega}{\omega_o}\right)\left(\frac{1}{\omega_o}\right) =$$

$$-\left[\left(\frac{s}{\omega_o}\right) - 2\left(\frac{s}{\omega_o}\right)^2 + 3\left(\frac{s}{\omega_o}\right)^3 - 4\left(\frac{s}{\omega_o}\right)^4 + \ldots\right]\left(\frac{\Delta\omega}{\omega_o}\right)$$

By taking "Inverse Laplace Transform" back to time domain, we have:

$$e_{sk}(t) \approx \left(\frac{\partial Y}{\partial t} - \frac{1}{\omega_o}\frac{\partial^2 Y}{\partial t^2} + \frac{1}{\omega_o^2}\frac{\partial^3 Y}{\partial t^3} - \frac{1}{\omega_o^3}\frac{\partial^4 Y}{\partial t^4} + \ldots\right)\Delta T$$

$$e_{bw}(t) \approx -\left(\frac{1}{\omega_o}\frac{\partial Y}{\partial t} - \frac{2}{\omega_o^2}\frac{\partial^2 Y}{\partial t^2} + \frac{3}{\omega_o^3}\frac{\partial^3 Y}{\partial t^3} - \frac{4}{\omega_o^4}\frac{\partial^4 Y}{\partial t^4} + \ldots\right)\left(\frac{\Delta\omega}{\omega_o}\right)$$

From equations above, $Y(s)=Y_{ideal}(s) \cdot H(s)=X(s) \cdot H(s)$ (i.e. filtered analog input signal).

Since H(s) is a desired response of loop filter common to ping-pong channels, the above equation is also identical to:

$$e_{sk}(t) \approx \left(\frac{\partial x}{\partial t} - \frac{1}{\omega_o}\frac{\partial^2 x}{\partial t^2} + \frac{1}{\omega_o^2}\frac{\partial^3 x}{\partial t^3} - \frac{1}{\omega_o^3}\frac{\partial^4 x}{\partial t^4} + \ldots\right)\Delta T$$

$$e_{bw}(t) \approx -\left(\frac{1}{\omega_o}\frac{\partial x}{\partial t} - \frac{2}{\omega_o^2}\frac{\partial^2 x}{\partial t^2} + \frac{3}{\omega_o^3}\frac{\partial^3 x}{\partial t^3} - \frac{4}{\omega_o^4}\frac{\partial^4 x}{\partial t^4} + \ldots\right)\left(\frac{\Delta\omega}{\omega_o}\right)$$

Notice that the effect of H(s) introduces finite gain error and phase shift according to input signal freq. that doesn't contribute odd image replica but the mismatch on two sampling systems.

In time domain, an earlier equation is converged linearly into:

$$y(t)=y_{ideal}(t)+e(t)=x(t)+e_{bw}(t)+e_{sk}(t)$$

Consider the absolute dynamic error signal e(t), $$e(t) \approx -\left[\left(\Delta T + \tau_{SAMP}\frac{\Delta\omega}{\omega_o}\right)\frac{\partial x}{\partial t} - \right.$$
$$\left.\left(\Delta T + 2\tau_{SAMP}\frac{\Delta\omega}{\omega_o}\right)\tau_{SAMP}\frac{\partial^2 x}{\partial t^2} + \left(\Delta T + 3\tau_{SAMP}\frac{\Delta\omega}{\omega_o}\right)\tau_{SAMP}^2\frac{\partial^3 x}{\partial t^3} + \ldots\right]$$

For instance, if $\Delta T=+/-1$ ps, $\tau_{SAMP}=1/(2*\pi*5G)=32$ ps and $\Delta\omega/\omega_o=1\%$, first order error term is bounded by +/−1.064 ps (in modern multi-GS/s ADC).

From the equation above, both $\Delta T$ and $\Delta\omega/\omega_o$ are somewhat related to signal/clock/component mismatches that could be reduced by properly layout and physical component sizing whereas $\tau_{SAMP}$ is circuit design parameter (PVT var.).

To mitigate the effect of dynamic errors, linearity performance (interleaving spur) can be reduced by design of a wider sampling bandwidth (lower $\tau_{SAMP}$) that tradeoff fundamentally with noise, power and other circuit design physical constraints.

From the above equation, it can be generalized into a Taylor Series Expansion error signal:

$$e(t) \approx -\left(\Delta t_1 \frac{\partial x}{\partial t} - \Delta t_2 \frac{\partial^2 x}{\partial t^2} + \Delta t_3 \frac{\partial^3 x}{\partial t^3} - \Delta t_4 \frac{\partial^4 x}{\partial t^4} + \ldots\right)$$

Consider a single carrier signal $x(t)=A\sin(\omega t)$, odd and even time derivatives are given by:

$$\frac{\partial x}{\partial t} = A\omega \cdot \cos(\omega t) \quad \frac{\partial^2 x}{\partial t^2} = -A\omega^2 \cdot \sin(\omega t) \quad \frac{\partial^3 x}{\partial t^3} = -A\omega^3 \cdot \cos(\omega t)$$

Error signal is proportional to amplitude A and Frequency of signal.

Error signals appear at 90 deg, 180 deg, 270 deg and so on (i.e. integer*Fs/2±Fin)→spurious tones. Both sampling pulse and finite bandwidth mismatches appear as pulse width difference error among channels. Therefore, it is possible to cancel it by adjusting the sampling pulse width via variable delay elements before samplers to align their effective sampling pulse width.

ALTERNATE EMBODIMENTS

Several other embodiments are contemplated by the inventors. For example clocks may be derived from other clocks and thus synchronized. Clocks may be buffered, enabled, and qualified by logic. The analog input signal may be buffered in a variety of ways and buffer arrangements or trees. While initial clearing of all bits in all SARs has been described, the SAR bits could all be initially cleared to a high state rather than to a low state. Active-low rather than active-high bit could be used.

All matrixes could be rotated or transposed, or otherwise operated upon so that columns become rows and rows become columns. Thus the terms row and column could be interchanged.

Binary-weighted capacitors 110, 108, 106, 104, . . . 102 could be connected to the power-supply or to some other voltage rather than to ground. These capacitors may be enabled by p-channel or n-channel transistors, and the bits stored in SAR delay 40 may be active-high or active-low, and these bits may be encoded in various ways and need to be decoded by a decoder in SAR delay 40. While binary-weighted capacitors 110, 108, 106, 104, . . . 102 have been shown, these capacitors could have other weight sequences, such as 1 C, 1 C, 2 C, 5 C, 11 C, 15 C, etc., and the Successive-Approximation-Register (SAR) programming could be adjusted for these non-binary sequence of weights. Rather than having binary-weighted capacitors 110, 108, 106, 104, . . . 102, SAR delay 40 could employ other weighted delay elements, such as resistors, transistors or buffers of various sizes or weights. While binary-weighted capacitors have been described, other weightings could be substituted, such as decimally-weighted, prime-weighted, or linearly-weighted, or octal-weighted. The digital delay value in the SAR could be in these other number systems, such as octal numbers rather than binary numbers. Other kinds of delay elements could be substituted, such as parallel current sources, resistors, or various combinations, and in parallel, serial, or combined network arrangements. Values may be shifted, transformed, or processed in a variety of ways.

While product derivative correlator 52 has been shown for a particular midpoint correlation, other correlation functions could be substituted and product derivative correlator 52 adjusted to perform these substitute correlation functions. Inversions and complements may be added at various locations. Switches 20, 22, 23, 24 may be simple transistor switches, pass transistors, transmission gates, or other kinds of switches. Sample delay 11, 146, 148 may be implemented as a latch or other storage element or as a delay with combinational logic including NAND, NOR, XOR, XNOR gates. Rather than use capacitors for delay elements, MOSFETs, FinFETs, or other devices, either p-channel or n-channel, driven to power or ground, may be used as delay elements.

While the first channel's SAR delay 40 has been described in step 204 as being initialized to the midpoint value of 1000 . . . 0, a different channel could be initialized, or the initial value could be another value, such as 0100 . . . 0, 0010 . . . 0, etc. Any channel could act as the fixed timing reference, and the timing delay of that fixed reference could be any value.

Matrix processor 50 may use a Digital Signal Processor (DSP) or other processor that is efficient when performing matrix operations. Product derivative correlators 52 may be implemented in hardware and in parallel for high-speed calibration. Various combinations of hardware, firmware, and software may be used in these implementations and for calibrator 55.

FIR filters 17 can act as lowpass or bandpass filters for calibration, as long as the polarity of its correlation derivatives is known. FIR filtering can help define the polarity of its correlation derivatives to a well-defined value or specification to calibrate the interleaved ADC for a known frequency range. Since correlation derivatives are frequency dependent, FIR filtering can prevent any potential convergence problems during calibration.

Sample delays 11, 146, 148 each could be reduced by 1 sample delay period for very fast logic that does not require pipelining to meet timing requirements. Alternately, these sample delays could be increased by 1 or more samples for very fast pipelined systems with slow logic delays.

While some operations have been described in a parallel manner for faster processing, serial operation may be used. When performed serially, a single instance of product derivative correlator 52 could be used rather than separate instances of product derivative correlator 52 in the hardware. While a bank of N product derivative correlators 52 have been shown, product derivative correlators 52 could be re-used or operate in various series and parallel arrangements.

The process steps could be performed serially, or some steps may be performed in parallel. Various sequences may be adjusted or modified. Higher-level operations may be performed in software or firmware, such as SAR testing and decision logic, while lower-level functions may be performed in hardware, such as using product derivative correlator 52 to generate product derivative factors F1, F2, F3, F4. Some or all of the calibration routine could be replaced with hardware such as programmable logic, FPGA, or other logic gates on an Integrated Circuit (IC) or another chip. Various combinations of hardware, software, firmware, etc. may be substituted.

Product derivative correlators could operate upon more than 3 inputs as another alternative. Analog input buffers could be rearranged, so that one analog input buffer drives 4 or 2 ADCs, or there may be a tree structure of analog input buffers with multiple levels.

The number of samples averaged M could be different for foreground and background calibration and could even differ for different capacitor bit-positions, such as more samples for LSB's that are more sensitive and fewer samples for MSBs. M could also differ for other reasons such as varying voltage or temperature conditions.

The analog input signal AIN does not have to be a sine wave, but could be other forms of AC signals, such as a triangular wave, sine waves of different frequencies that are superimposed, or any wireless baseband signal. When the polarity of the correlation derivative can be determined, these signals may be used as input signals for calibration.

Averaging of the product derivative factors F1, F2, F3, F4 could be performed by setting a flip-flop when the sign bit is 1 and clearing the flip-flop when the sign bit is 0 for the current sum.

A flip limit FL may be used for ending background calibration when incrementing the LSB keeps flipping sign bits more than the FL times. Alternately, background calibration can end when the sign bits first flip.

The number of channels N can be binary, non-binary, even or odd. While 4 channel interleaving has been shown in detail, 8-channel, 7-channel, 6-channel, 16-channel, 32-channel, or N-channel interleaved ADC's may be substituted. The interleave order of the channels may be changed. Interleaving may be nested or may be one long loop at level 1.

Additional components may be added at various nodes, such as resistors, capacitors, inductors, transistors, etc., and parasitic components may also be present. Enabling and disabling the circuit could be accomplished with additional transistors or in other ways. Pass-gate transistors or transmission gates could be added for isolation. Inversions may be added, or extra buffering. Capacitors may be connected together in parallel to create larger capacitors that have the same fringing or perimeter effects across several capacitor sizes. Switches could be n-channel transistors, p-channel transistors, or transmission gates with parallel n-channel and p-channel transistors, or more complex circuits, either passive or active, amplifying or non-amplifying.

The number of ADC digital bits may be adjusted. For example, a 15 bit ADC could be used, or an 8-bit, 6-bit, 22-bit, or 18-bit. A different number of bits could be substituted for a different precision, and the number of bits could be fixed or could be variable.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A matrix-calibrated interleaved Analog-to-Digital Converter (ADC) comprising:
a plurality of N channels, wherein N is a whole number of at least 4, wherein each of the plurality of N channels comprises:
an ADC for converting a sampled analog input into a digital output having a digital value representing the sampled analog input;
an analog switch that samples an analog input in response to a delayed clock;
a Successive-Approximation-Register (SAR) that is programmed with a delay value during calibration;
a variable delay element having a variable delay that is controlled by the delay value stored in the SAR, the variable delay element delaying an input sampling clock by the variable delay to generate the delayed clock to the analog switch;
a product derivative correlator for correlating the digital output of a channel to the digital output of adjacent channels in the plurality of channels to generate a product derivative factor for the channel; and
a matrix processor for receiving the product derivative factor for each of the plurality of N channels and for multiplying a plurality of the product derivative factors with a correlation matrix to generate a sign vector having a correlation sign for N−1 of the plurality of N channels;
wherein the SAR is programmed with delay values to compensate for timing skews among the plurality of N channels using a Successive-Approximation calibration routine that examines the correlation sign in the sign vector to determine when to accept or reject trial bits in the SAR of a channel corresponding to the correlation sign in the sign vector.

2. The matrix-calibrated interleaved ADC of claim 1 wherein the product derivative correlator for a current channel comprises:
a first sample delay that delays the digital output of the current channel by one pulse of a sample clock to generate a first delayed sample;
a second sample delay that delays the digital output of a first adjacent channel to the current channel by one pulse of a sample clock to generate a second delayed sample;
a third sample delay that delays the digital output of a second adjacent channel to the current channel by one pulse of a sample clock to generate a third delayed sample;
wherein the first adjacent channel and the second adjacent channel are in the plurality of N channels;
a first adder that subtracts the first delayed sample from the second delayed sample to generate a first sum; and
a first multiplier that multiplies the first sum by the first delayed sample to generate a first product that is the product derivative factor for the channel for a sample.

3. The matrix-calibrated interleaved ADC of claim 2 wherein the product derivative correlator further comprises:
an average generator that averages the first product over a plurality of M samples of the analog input to generate the product derivative factor as an averaged product derivative factor,
wherein M is a whole number.

4. The matrix-calibrated interleaved ADC of claim 3 wherein the product derivative correlator in each channel further comprises:
a Finite-Impulse-Response (FIR) filter for filtering the digital output from the ADC, wherein the digital output input is a filtered digital output.

5. The matrix-calibrated interleaved ADC of claim 4 wherein N is a non-binary number.

6. The matrix-calibrated interleaved ADC of claim 4 wherein N is an odd number.

7. The matrix-calibrated interleaved ADC of claim 4 further comprising:
a Successive-Approximation calibrator, for each correlation sign in the sign vector
(a) adding a test bit-position to the SAR of a channel having a corresponding correlation sign in the sign vector having a value of 1;
(b) subtracting the test bit-position to the SAR of the channel having the corresponding correlation sign in the sign vector having a value of 0;
and repeating from (a) for successively smaller bit-positions in the SAR,
whereby the correlation sign in the sign vector is used to add or subtract successive bit-positions in the SAR.

8. The matrix-calibrated interleaved ADC of claim 7 wherein the Successive-Approximation calibrator sets the SAR for a reference channel in the plurality of channels to a fixed value;
wherein the Successive-Approximation calibrator does not adjust the fixed value in the SAR of the reference channel, the Successive-Approximation calibrator adjusting the SAR for N−1 channels of the plurality of N channels.

9. The matrix-calibrated interleaved ADC of claim 4 wherein the digital output from the ADC is at least 6 bits.

10. The matrix-calibrated interleaved ADC of claim 2 wherein the variable delay element comprises a plurality of binary-weighted capacitors that are each enabled by a bit in the SAR.

11. A calibration matrix method for reducing timing skews among channels in an interleaved Analog-to-Digital Converter (ADC) comprising:
clearing all bits in all Successive-Approximation-Registers (SARs) that set variable input delays from an analog input to ADCs that are interleaved together, each ADC sampling the analog input and generating an ADC digital output;
setting bits in a SAR for a reference channel to a midpoint value;
wherein each channel has a SAR, an ADC, and an input delay element having a variable input delay set by the SAR;
(a) for each channel:
inputting the ADC digital outputs from a current channel and from a prior adjacent channel and from a next adjacent channel to a product derivative correlator that generates a sampled product derivative factor that quantifies correlation of the ADC digital output of the current channel to the ADC digital output of prior adjacent cannel and the ADC digital output of the next adjacent channel;
averaging the sampled product derivative factor over multiple samples of the analog input to generate a product derivative factor for the current channel;
arranging the product derivative factors for all channels into a factor matrix;
multiplying the factor matrix by a correlation matrix to generate a sign vector having sign bits corresponding to channels;

setting a current bit-position to a level-1 Most-Significant Bit (MSB) position in the SARs;
for all channels except the reference channel:
(b) setting a test bit at the current bit-position in the SAR of a selected channel to adjust the variable input delay when a sign bit in the sign vector corresponding to the selected channel is 1;
(c) clearing a test bit at the current bit-position in the SAR of a selected channel to adjust the variable input delay when the sign bit in the sign vector corresponding to the selected channel is 0;
decreasing the current bit-position and repeating from (a) until the current bit-position is a Least-Significant Bit (LSB) in the SARs;
ending calibration when all product derivative correlators have been used to adjust settings in the SARs to adjust the variable input delays to minimize timing skews among all channels.

12. The calibration matrix method of claim 11 further comprising:
a background calibration routine activated to adjust settings in the SARs that were previously set by calibration, the background calibration routine comprising:
(a) for each channel:
inputting the ADC digital outputs from a current channel and from a prior adjacent channel and from a next adjacent channel to a product derivative correlator that generates a sampled product derivative factor that quantifies correlation of the ADC digital output of the current channel to the ADC digital output of prior adjacent cannel and the ADC digital output of the next adjacent channel;
averaging the sampled product derivative factor over multiple samples of the analog input to generate a product derivative factor for the current channel;
arranging the product derivative factors for all channels into a factor matrix;
multiplying the factor matrix by a correlation matrix to generate a sign vector having sign bits corresponding to channels;
setting a current bit-position to a level-1 Most-Significant Bit (MSB) position in the SARs;
for all channels except the reference channel:
(b) adding a Least-Significant Bit (LSB) test bit at a LSB bit-position in the SAR of a selected channel to adjust the variable input delay when the sign bit in the sign vector corresponding to the selected channel is 1 and when the sign bit from a prior iteration was 1;
(c) subtracting the LSB test bit at the LSB bit-position in the SAR of a selected channel to adjust the variable input delay when the sign bit in the sign vector corresponding to the selected channel is 0 and when the sign bit for a prior iteration was 0;
repeating from (a) until an endpoint is reached.

13. The calibration matrix method of claim 11 wherein all product derivative correlators in a level are calibrated in parallel.

14. The calibration matrix method of claim 11 wherein a physical product derivative correlator is re-used for multiple levels of product derivative correlators that are processed serially.

15. A calibrating-matrix interleaved Analog-to-Digital Converter (ADC) comprising:
a plurality of N channels, wherein N is a whole number of at least 3, each channel comprising:
an ADC having a sampled analog input and a digital output;
a sampling switch between an analog input and the sampled analog input, the sampling switch responsive to a delayed clock;
a Successive-Approximation-Register (SAR) that stores a delay setting;
a delay element generating a variable delay between an input clock and the delayed clock, wherein the variable delay is determined by the delay setting in the SAR;
a filter for generating a filtered channel output from the digital output of the ADC;
a product derivative correlator, receiving the filtered channel output of a channel and the filtered channel outputs from adjacent channels, the product derivative correlator generating a product derivative factor indicating a correlation of the channel to the adjacent channels;
a matrix processor that receives a plurality of the product derivative factor from the product derivative correlator for the plurality of N channels and generates a sign-bit vector by multiplying the plurality of the product derivative factor with a correlation matrix; and
a calibrator, using each sign bit in the sign-bit vector to decide when to add a test bit to the SAR for a channel, and when to remove the test bit from the SAR for the channel, wherein each sign bit in the sign-bit vector is for adding or removing a test bit from a SAR in a different channel in the plurality of N channels.

16. The calibrating-matrix interleaved of claim 15 wherein the matrix processor forms the plurality of the product derivative factor from the plurality of N channels into a product derivative factor matrix having N rows and 1 column, wherein the correlation matrix has N−1 rows and N columns, and the sign-bit vector has N−1 sign bits.

17. The calibrating-matrix interleaved of claim 16 wherein the correlation matrix is generated form a shift matrix having N rows and N−1 columns, wherein the correlation matrix is a transpose of the shift matrix divided by a product of the transpose of the shift matrix and the shift matrix.

18. The calibrating-matrix interleaved of claim 15 wherein the adjacent channels comprise 2 immediately adjacent channels, wherein the product derivative correlator generates the product derivative factor indicating a correlation of the channel to the 2 immediately adjacent channels.

19. The calibrating-matrix interleaved ADC of claim 15 wherein the product derivative correlator further comprises:
an averager for averaging a sample product derivative factor from the product derivative correlator over M analog input samples, where M is a whole number, to generate the product derivative factor output to the matrix processor.

20. The calibrating-matrix interleaved of claim 15 wherein the calibrator further comprises:
a tester for setting a test bit-position in the SAR for all channels having the sign bit having a value of 1 in the sign-bit vector and for clearing the test bit-position in the SAR for all channels having the sign bit having a value of 0 in the sign-bit vector, and for repeating for successively smaller bit-positions in the SAR,
whereby the sign bit of each channel is used to add or subtract successive bit-positions in the SAR.

* * * * *